United States Patent [19]

Hirama et al.

[11] Patent Number: 4,870,313
[45] Date of Patent: Sep. 26, 1989

[54] PIEZOELECTRIC RESONATORS FOR OVERTONE OSCILLATIONS

[75] Inventors: Kouichi Hirama; Tomokazu Shouzi; Yoshiaki Tanaka, all of Kouza, Japan

[73] Assignee: Toyo Communication Equipment Co., Ltd., Japan

[21] Appl. No.: 191,628

[22] Filed: May 9, 1988

Related U.S. Application Data

[63] Continuation-in-part of Ser. No. 945,656, Jan. 22, 1987, abandoned.

[30] Foreign Application Priority Data

Apr. 11, 1985 [JP] Japan ................................. 60-77065
May 31, 1985 [JP] Japan ............................... 60-119055
Jan. 20, 1986 [JP] Japan ................................... 61-9756
Jan. 21, 1986 [JP] Japan ................................. 61-10824
Jan. 21, 1986 [JP] Japan ................................. 61-10825
Apr. 11, 1986 [JP] Japan ................................. 61-10826

[51] Int. Cl.$^4$ .......................................... H01L 41/08
[52] U.S. Cl. ................................. 310/320; 310/312; 310/324; 310/326; 310/351; 310/365; 310/366; 310/369
[58] Field of Search .............. 310/311, 312, 320, 324, 310/326, 322, 351-353, 360, 365, 366, 369, 367

[56] References Cited

U.S. PATENT DOCUMENTS

| | | | |
|---|---|---|---|
| 2,249,933 | 7/1941 | Bechmann | 310/365 X |
| 3,382,381 | 5/1968 | Horton | 310/365 X |
| 3,384,768 | 5/1968 | Shockley et al. | 310/320 |
| 3,585,418 | 6/1971 | Koneval | 310/325 |
| 3,684,905 | 8/1972 | Martyn | 310/326 |
| 3,699,484 | 10/1972 | Berlincourt | 310/326 |
| 3,747,176 | 7/1973 | Toyoshima | 310/326 |
| 4,114,062 | 9/1978 | Mattuschka | 310/326 |
| 4,365,181 | 12/1982 | Yamamoto | 310/320 |
| 4,381,469 | 4/1983 | Ogawa et al. | 310/346 |
| 4,456,850 | 6/1984 | Inoue et al. | 310/324 |
| 4,502,932 | 3/1985 | Kline et al. | 310/324 |

FOREIGN PATENT DOCUMENTS

| | | |
|---|---|---|
| 1656270 | 7/1969 | Australia . |
| 2516307 | 10/1976 | Fed. Rep. of Germany . |
| 45-5196 | 2/1970 | Japan . |
| 58-31609 | 2/1983 | Japan . |
| 58-175314 | 10/1983 | Japan . |
| WO86/06228 | 10/1986 | PCT Int'l Appl. ............... 310/320 |
| 1190304 | 7/1968 | United Kingdom . |
| 2069752 | 8/1981 | United Kingdom . |

OTHER PUBLICATIONS

Comparini, A. A., et al., "Flexural, Width-Shear, Width-Twist Vibrations in Extensional Mode Lithium Tantalate Resonators", 1973 Ultrasonics Symposium Proceedings, Monterey, Nov. 5-7, 1973, pp. 375-377, New York; (p. 375), left col. line 5-18).

Roberts, D. A., "CdS-Quarts Monolithic Filters for the 100-500 MHz Frequency Range", Proceedings of the Twenty-Fifth Annual Frequency Control Symposium, Fort Monmouth, N.J., Apr. 26-28, 1971, pp. 251-261, Electronic Industries Association, Washington, U.S.; (p. 252, right col., line 22-24).

Sykes, R. A., et al., "Monolithic Crystal Filters", IEEE International Convention Record, vol. 15, part II, Mar. 20-23, 1967, pp. 78-93; (p. 86, left col., line 27, right col., line 7, FIG. 17).

Kitayama, M., et al., "VHF/UHF Composite Resonator on a Silicon Substrate", Japanese Journal of Applied Physics, Supplements, vol. 22, suppl. 22-3 1983, pp. 139-141, Tokyo, JP; (FIG. 1).

Primary Examiner—Mark O. Budd
Attorney, Agent, or Firm—Welsh & Katz, Ltd.

[57] ABSTRACT

For the purpose of utilizing the characteristic in a vibration energy entrapping mode of a higher order symmetric or asymmetric mode vibration generated when a piezoelectric resonator is excited, there are provided a portion having a cutoff frequency $f_2$ about an energy entrapping portion having a cutoff frequency $f_1$ for strongly exciting a higher order symmetric or asymmetric mode vibration and at least one energy absorbing portion having a cutoff frequency $f_3$ (at least $f_1$ and $f_3 < f_2$). The size of the energy entrapping portion (electrode), amount of plateback $(f_2 - f_1)/f_2$, the substrate thickness and a gap between the energy entrapping portion and the energy absorbing portion are selected such that the vibration energy of the overtone vibration whose orders are equal to or higher than the n-th overtone is substantially entrapped in a portion near the periphery of the energy entrapping portion, while the vibration energy of overtone vibrations of (n-2)th order or lower order including the fundamental vibration is caused to spread over the entire body of the substrate.

19 Claims, 23 Drawing Sheets $\psi = \dfrac{f - f_1}{f_2 - f_1}$ $T = \dfrac{Ka}{2/\pi}$

K = COEFFICIENT OF PROPAGATION

Δ : % OF FREQUENCY DECREASE $\left(\Delta = \dfrac{f_2 - f_1}{f_2}\right)$ n : ORDER OF OVERTONE

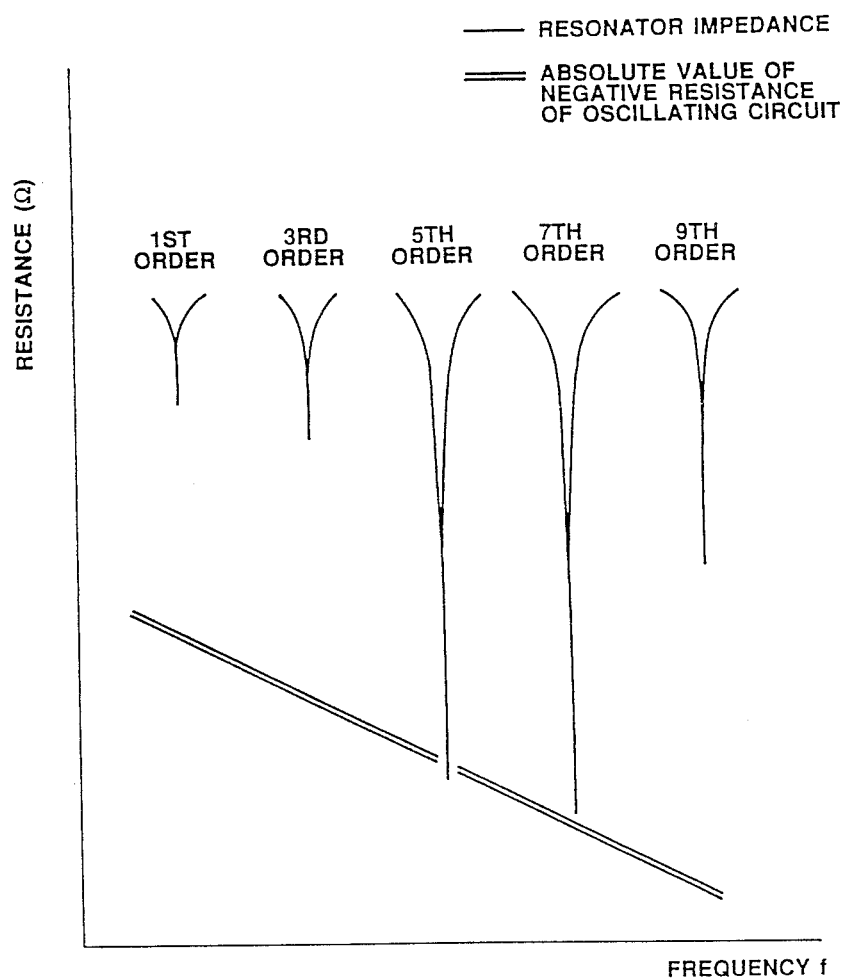

FIG.11
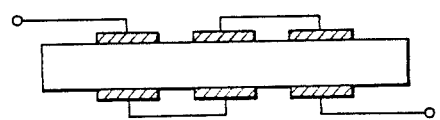
FIG.11
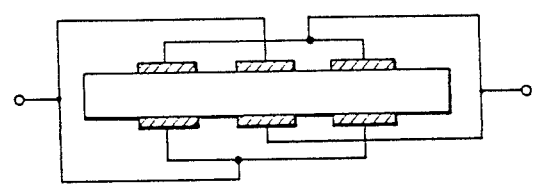
FIG.12a          FIG.12b
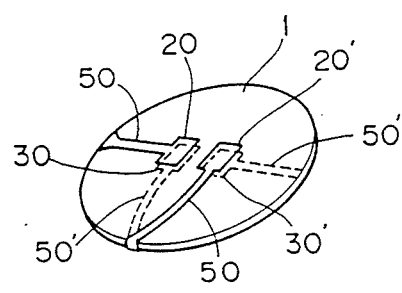 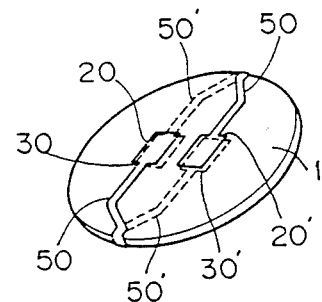
FIG.12c          FIG.12d
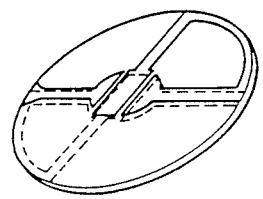 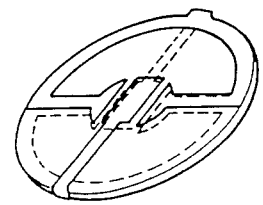

AT CUT QUARTZ
SUBSTRATE FREQUENCY 79.686MHZ
ELECTRODE AG 400Å
LOWEST ORDER ASYMMETRIC MODE
SPLIT IN Z
ELECTRODE CONNECTION PARALLEL

AT CUT QUARTZ
SUBSTRATE FREQUENCY 79.686MHZ
ELECTRODE AG 400Å
LOWEST ORDER
ASYMMETRIC MODE
SPLIT IN Z'
ELECTRODE
CONNECTION PARALLEL

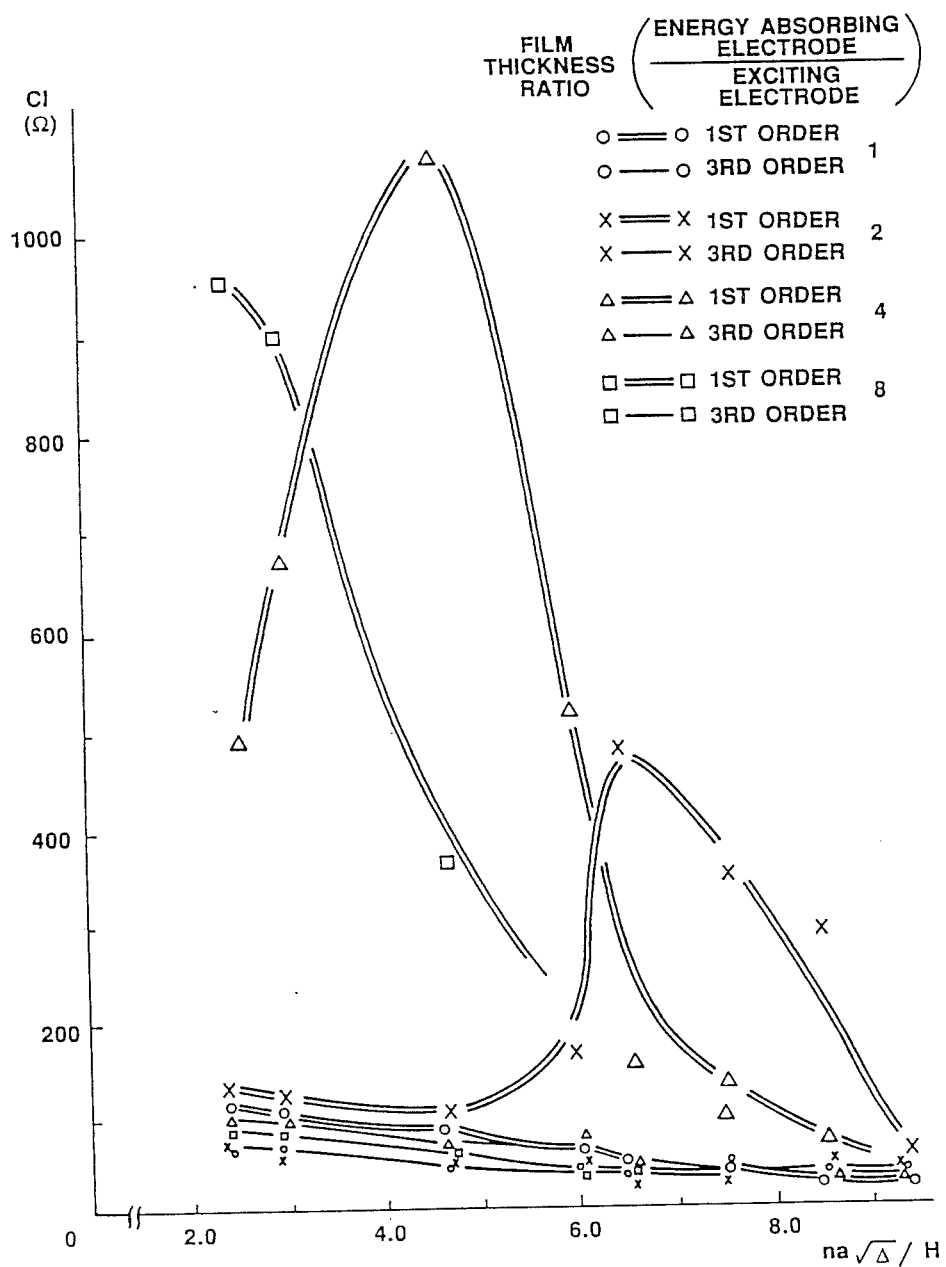

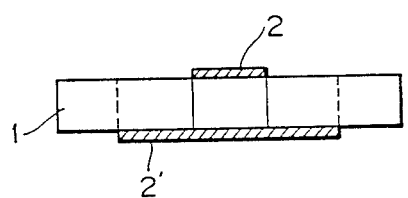
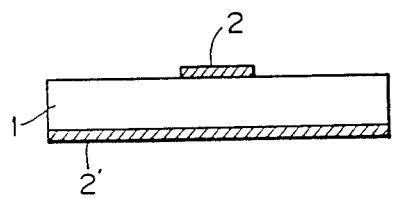
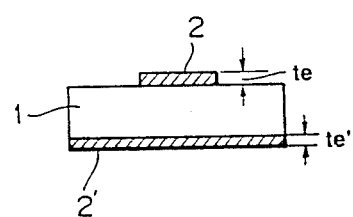
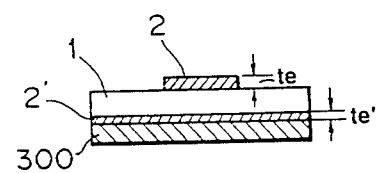
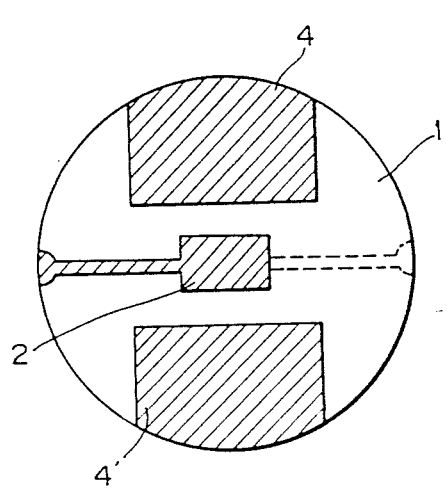
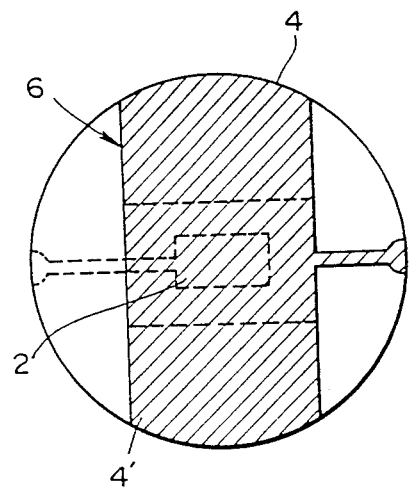

PIEZOELECTRIC RESONATORS FOR OVERTONE OSCILLATIONS

This application is a continuation-in-part of the application bearing Ser. No. 945,656 filed on Jan. 22, 1987 entitled "Piezoelectric Resonators for Overtone Oscillations", now abandoned.

FIELD OF ART

This invention relates to a piezoelectric resonator, and more particularly a piezoelectric resonator for overtone oscillation capable of oscillating at a desired overtone frequency without requiring a special oscillating circuit.

BACKGROUND ART

In recent years, demand for higher frequency operation and miniaturization has become further increased in electric communication apparatus and various electronic apparatus. To satisfy such demand, in addition to the utilization of overtone vibrations of conventional piezoelectric resonator such as a quartz vibrator, a surface acoustic wave (SAW) resonator is now being used in many fields of application.

The piezoelectric oscillator is designed such that a desired output is extracted through an LC resonance circuit that resonates to a desired overtone frequency or that a LC resonance circuit is inserted into a portion of an oscillation circuit to make the negative resistance of the oscillation circuit sufficiently large at a desired overtone frequency region. In any case, however, it is necessary to use a coil which is extremely inconvenient for the oscillation circuit to be incorporated into an integrated circuit.

On the other hand, as is well known in the art, the oscillation frequency of a SAW resonator is principally determined by the material constituting a piezoelectric substrate, and the pitch of interdigital transducer (IDT) electrodes formed on the surface of the piezoelectric substrate so that not only the resonator itself can be miniaturized but also above described circuit problems can be obviated. However, this type of resonator is defective in that its frequency-temperature characteristic is much inferior than that of an AT cut crystal resonator.

Factory workers manufacturing crystal vibrators have noticed a phenomenon that a crystal vibrators after oscillates in 3rd or 5th order overtones when the ratio between the length and the width of a crystal substrate, and the ratio of the side length with respect to the thickness of the substrate fall within a specified range as a result of miniaturization of the crystal substrate required for a small vibrator. To suppress such phenomenon has been subject to be studied.

U.S. Pat. No. 4,114,062 to Siemens discloses technology for utilizing this phenomenon so as to produce crystal vibrators for overtone oscillation.

The U.S. Patent, however, is unable to serve as a practical use because it has several problems as follows:

Considering a disc shaped substrate which is most typical shape for a vibrator substrate, the diameter of the substrate is extremely small, merely 20–30 times of the substrate thickness, and the diameter of the electrodes is about 50–90% of that of the substrate. Since the distortion of the support around the periphery of the substrate affects the oscillating portion, there arise problems that the frequency-temperature characteristic becomes unstable, resonant frequency varies before and after the thermo-cycle, and the resonant frequency greatly changes with its aging.

To solve these problems, U.S. Pat. No. 4,188,557 to Siemens proposes machining a piezoelectric substrate used in a small piezoelectric resonator for overtone oscillation into a convex shape.

However, merely entrapping overtone vibration energy of higher order than a desired order within excitation electrodes while forming a crystal substrate of a specific dimensional ratio, or merely providing a dot or line shaped dumping member at the periphery of the vibrator substrate is not sufficient at all for vibration energy whose overtone vibration order is lower than the desired order to be consumed. Accordingly, a vibrator of the above-mentioned type has a defect that it cannot provide a stable oscillation in overtone vibration of a desired order, and therefore no further study has been made on this type of vibrators.

DISCLOSURE OF THE INVENTION

This invention was made in view of the defects of the prior art high frequency resonator and has an object of providing a piezoelectric resonator for an overtone oscillation utilizing a vibration of a higher order harmonic or anharmonic mode, which enables oscillation of a desired overtone frequency with substantially the same form as the conventional piezoelectric resonator so that it is not necessary to substantially change the manufacturing steps and to add an LC resonance circuit to the oscillation circuit.

To accomplish the object described above, the overtone oscillation resonator of this invention is constructed as follows:

More particularly, for the purpose of utilizing the characteristic in a vibration energy trapping mode of a higher over symmetric or asymmetric mode vibration which is generated at the time of exciting a piezoelectric resonator, according to the overtone oscillation resonator embodying the invention, a portion having a cutoff frequency $f_2$ is formed around an energy entrapping portion having a cutoff frequency $f_1$ ($f_1 < f_2$) on a piezoelectric substrate so as to strongly excite a higher order symmetric or asymmetric mode vibration, thereby substantially entrapping the vibration energy of an overtone vibration of the order equal to or higher than the n-th overtone among the vibrations of the higher order harmonic or anharmonic mode vibration within the energy entrapping and its periphery, and the size of the energy entrapping portion (electrode), an amount of plate back $(f_2 - f_1)/f_2$ and the substrate thickness are selected such that the vibration energy of an overtone vibration of equal to or less than (n−2)th order including the fundamental frequency is caused to be dispersed over the entire body of the substrate.

Further, at least a vibration energy absorbing area whose cutoff frequency is lower than $f_2$ is applied to a suitable portion near the outer periphery of the piezoelectric substrate so as to efficiently dissipate of the vibration energy of overtone energy of orders equal to or lower than (n−2)th overtone vibration including the fundamental wave vibration spreading over the entire body of the substrate.

A resistor having a suitable resistance value may be connected across electrodes attached to opposing surfaces of the vibration energy absorbing area of the piezoelectric substrate near the outer periphery thereof so as to facilitate dissipation of the vibration energy spread over the entire body of the substrate.

The overtone oscillation resonator according to this invention can be also utilized as a resonator for a GHz band by utilizing a composite material.

More particularly, the overtone oscillation resonator of this invention is constructed such that a recess or opening is formed at a proper portion of a block made of silicon, quartz, glass, metal, etc., the recess or opening is covered by a thin layer having a desired thickness and made of the same material as the block, and a piezoelectric portion made of $z_nO$, etc. and provided with appropriate electrodes is applied onto the thin layer. The electrode portion (actually, contact portion to the piezoelectric portion) is used as the vibration energy entrapping portion having a cutoff frequency $f_1$, the interface between the periphery of the electrode portion and the recess or opening of the block is utilized as a vibration energy propagating portion having a cutoff frequency $f_2$, and the block is utilized as a vibration energy absorbing area having a cutoff frequency $f_3$. The relation among the cutoff frequencies of the various portions are made to be $f_3 < f_1 < f_2$, and various parameters such as electrode size, amount of plate back etc. are suitably selected in accordance with the percentage of entrapping of the vibration energy in the order of overtone being oscillated.

Furthermore, the invention provides an overtone oscillation resonator not depending upon the characteristic of the oscillation circuit.

To provide such resonator, in the resonator of this invention, the cutoff frequency of the absorbing energy absorption area near the periphery of the piezoelectric substrate is made to be smaller, preferably much smaller than that of the vibration energy entrapping portion attached with exciting electrodes.

Furthermore, the invention provides an overtone oscillation resonator capable of compensating for the degradation of the resonator characteristic caused by the shift of the position of an additional vapor deposition necessary for fine adjustment of the oscillation frequency, greatly decreasing the influence upon the resonator characteristics caused by the difference in the thickness of the piezoelectric substrate, and greatly increasing the upper limit of the resonance frequency.

For this reason, in the resonator of this invention, the electrode area on the rear surface is made to be larger than the area corresponding to the electrode on the front surface.

BRIEF DESCRIPTION OF THE DRAWINGS

In the accompanying drawings:

FIG. 5 is a graph for explaining the relationship among the impedance and the negative resistance of the oscillation circuit at respective overtone frequencies of the resonator;

FIG. 6b is a side view of the resonator shown in FIG. 6a;

FIG. 8b shows a vibration energy distribution in various vibration modes generated by the resonator shown in FIG. 8a;

FIG. 11a and 11b shows examples of the series connection and parallel connection of the electrodes of a resonator utilizing a $S_1$ mode oscillation;

FIG. 12a and 12b are perspective views showing series connection and a parallel connection of the electrode divided into two sections;

FIG. 12c and 12d are perspective views showing a series connection and a parallel connection of the electrode divided into three sections;

FIG. 14a and 14b are plan views showing the construction of the resonators utilized for the confirmation experiments of this invention in which FIG. 14a shows a resonator not provided with a vibration energy absorbing portion, and FIG. 14b shows a resonator provided with a vibration energy absorbing portion;

FIG. 19b is a sectional view taken along a line A—A in FIG. 19a;

FIG. 21b is a plan view of the embodiment shown in FIG. 21a;

FIG. 26 is a graph showing the result of experiment for investigating a CI value regarding an overtone oscillation of an order at which oscillation is desired for a film thickness ratio of the vibration energy absorbing area and the CI value of the overtone vibration of a lower order to be suppressed;

FIGS. 28a and 28b show different electrode constructions according to this inventions;

FIG. 29a and 29b are sectional views for explaining the face that the characteristic does not vary even when the frequency is adjusted where the size of the piezoelectric substrate of the resonator of this invention varies;

FIG. 30a and 30b are front and rear views of an overtone oscillation piezoelectric oscillator of one embodiment of this invention;

PREFERRED EMBODIMENTS OF THE INVENTION

Figure 1A:
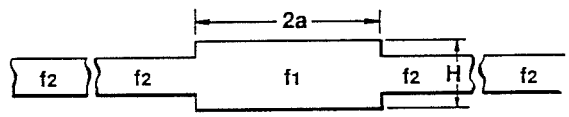
FIG. 1a is a diagrammatic sectional view of a piezoelectric substrate useful to explain the concept of this invention.

In the following, the theory of this invention and the embodiments shown in the drawings will be described.

Prior to the description of the preferred embodiments, the theory of this invention will firstly be described to have better understanding of the invention.

The facts on which the inventive concept is based are as follows.

(1) The energy trapping theory by Shockley/Onoe is a pure elastic analysis in which a SH wave is employed for the analysis. However, this theory is applicable to qualitative behavior of vibrations for piezoelectric vibrators in general types which employ material of high electro-mechanical coupling coefficient such as metal, quartz, lithium tantalate, lithium niobate, or piezoelectric ceramic as vibration media, for all vibration modes including a thickness shar a thickness twist, and thickness longitudinal, etc., and for different orders of overtone vibrations.

Figure 1B:
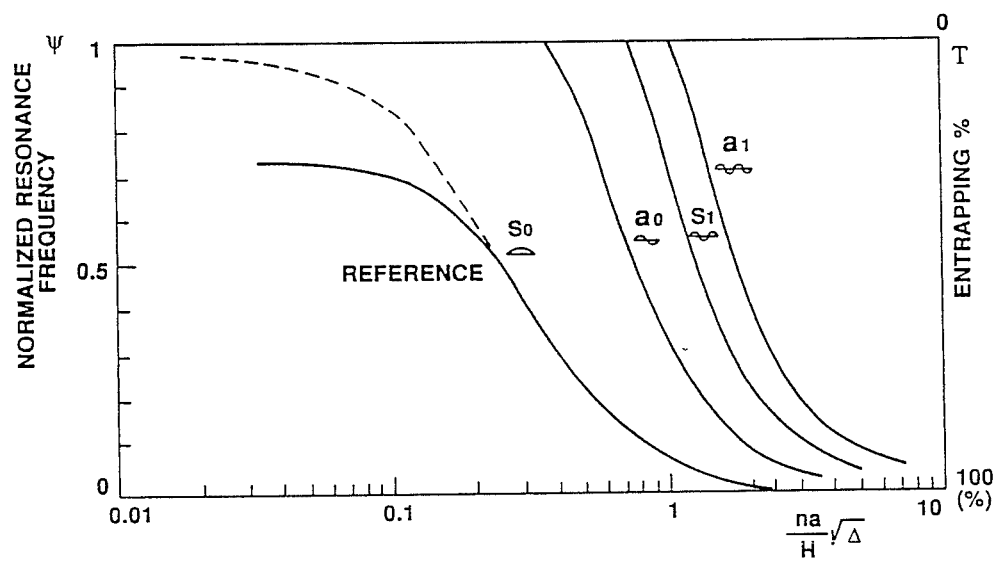
FIG. 1b shows vibration spectra in the symmetric and asymmetric modes.

(2) According to the energy trapping theory, where a portion having a cutoff frequency $f_2$ presents around a portion having a cutoff frequency $f_1$ as shown in FIG. 1a, the vibration energy will be entrapped in a portion (a portion of $f_1$) having a low cutoff frequency and the extent of entrapping will be shown in FIG. 1b.

In FIG. 1b, the ordinate shows normalized resonance frequency expressed by an equation $\Psi=(f-f_1)/(f_2-f_1)$, and wherein $\Psi=1$ means $f=f_2$ which is not influenced by a portion having a cutoff frequency $f_1$ as shown in FIG. 1a. In other words, this means absence of the portion, in which case the oscillation energy spreads over the entire body of the substrate and no entrapping of vibration energy.

On the other hand, a case wherein $\Psi=0$ means contrary to the above that all vibration energy is entrapped in a portion having a cutoff frequency $f_1$. A parameter $na\sqrt{\Delta}/H$ along the abscissa designates an entrapping coefficient which is determined by the order of the overtone "n", the size "a" and thickness "H" of a portion having a cutoff frequency $f_1$ and the amount of frequency decrease $$\text{frequency decrease } \Delta = \frac{f_2 - f_1}{f_2}).$$

(3) In the entrapping coefficient, where "a", "$\sqrt{\Delta}$" and "H" are constants of suitable values, the degree of energy entrapping becomes usually large as the overtone order number "n" increases. However, as the entrapping coefficient becomes large, the degree of energy entrapping reaches a large value not to be substantially influenced by the order of the overtone.

This phenomenon is also seen in the cases where $S_O$ mode (harmonic/symmetric mode) vibration shown in FIG. 1b or vibrations in other modes such as higher order anharmonic symmetric mode ($S_1$, $S_2$, ...) and anharmonic asymmetric modes ($a_0$, $a_1$, $a_2$, ...) are excited in the piezoelectric substrate.

However, considering curves shown in FIG. 1b, it should be noted that where the entrapping coefficient $na\sqrt{\Delta}/H$ is less than a given value, no entrapping mode presents in the vibration of high order anharmonic asymmetric modes ($S_2$, $S_2$ ---) and the vibrations of anharmonic asymmetric modes ($a_1$, $a_2$ ---). This characteristic does not present in the lowest order of ($S_o$) mode (harmonic mode).

(4) These curves in FIG. 1b will be changed to a certain extent depending on the vibration medium, vibration mode, direction of vibration propagation and order of overtone vibration, etc. However, the qualitative nature of the curves will not deviate greatly from the curves in FIG. 1b.

Accordingly, FIG. 1b is applicable to piezoelectric vibrators which employ metal, quartz lithium tantalate, lithium niobate, piezoelectric ceramic as vibration media, for all vibration modes including a thickness twist, and thickness longitudinal, etc., and for different vibration energy propagation directions, and different orders of overtone vibrations.

In this case, amendment should be made according to the nature of the piezoelectric substrate to be used prior to setting required parameters. However, when higher accuracy is required, it is necessary to prepare and use appropriate curves.

(5) Parameters which can be used to change the entrapping coefficient na$\sqrt{}$/ΔH, are the size of a portion having a cutoff frequency $f_1$ (usually on which an electrode is attached), and the amount of frequency decrease $\Delta=((f_2-f_1)/f_2)$ caused by the addition of a mass on a surface of piezoelectric plate.

However, where materials having high density such as lithium niobate and lithium tantalate is used as the oscillation medium, the effect of frequency decrease caused by the attachment of electrode material is not remarkable so that where it is impossible to sufficiently vary "Δ", variation of "a" is effective.

(6) Regarding the vibration whose energy is entrapped, as the order of overtone increase, the equivalent resistance becomes large.

As can be clearly noted from FIG. 1b, the vibration energy is not perfectly entrapped in a portion having a small cutoff frequency but more or less leaks to the peripheral portions having higher cutoff frequencies, but if a portion which absorbs the leakage energy and converts the same into heat presents extremely close to a portion having a smaller cutoff frequency, the equivalent resistance for the vibration becomes large.

In this regard, in a conventional quartz resonator, sufficiently thick electrodes are attached to the center of the quartz plate so as to give large difference between the cutoff frequencies $f_1$ and $f_2$ so as to entrap in the electrode portion the vibration energy of the overtones of all orders. Accordingly, conventional crystal resonators in which the CI value of the fundamental frequency becomes minimum oscillate in the fundamental frequency. Therefore, if one wants to cause the crystal resonators to oscillate in an overtone mode, some modification is necessary for the oscillation circuit.

It should be noted that the invention of the above mentioned Siemens's patent application, who was not able to find the fundamental theory of the resonator for overtone oscillation which we have discussed above, has mistakenly recognized that the most important parameter for producing the oscillation by overtone vibration of a desired order is to determine the ratio of dimension of the piezoelectric substrate within a specified range based on the knowledge of factory workers. Accordingly, he selected a dimensional ratio of the substrate which is extremely unreasonable to construct practical resonators.

(7) The characteristic of a symmetric ($S_0$, $S_1$, $S_2$, . . . ) or asymmetric ($a_0$, $a_1$, $a_2$, . . . ) mode shown in FIG. 1b is the result of theoretical analysis regarding infinite (solid line) plate. However, when this characteristic can be preserved substantially even in a substrate of a finite plate, since the vibration energy spreads over the entire body of the substrate, the energy will leak from a holding portion for the substrate edges or dissipate in the holding portion. Accordingly, the equivalent resistance on the vibration will become extremely high.

Based on the facts described above, let us consider that the characteristic of the vibration of a symmetric or asymmetric mode on the infinite plate described in items (2) and (3) can be retained in what degree on the finite plate.

Figure 2A:
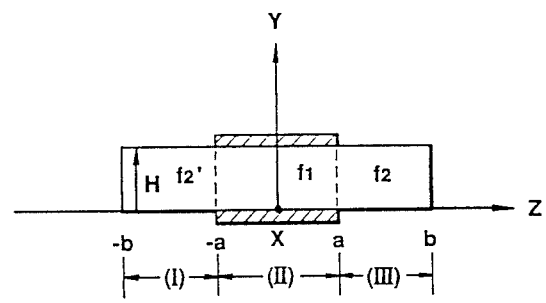
FIG. 2a is a model of a substrate for proving the fact that the vibration spectra hold even on a substrate of a limited area.

FIG. 2a is a diagrammatic sectional view showing an energy entrapping type resonator having an infinite length in the x direction, a limited width 2b in the z direction and electrodes applied to the lateral center of the substrate and having a width of 2a.

Among the wave motions, it is sufficient to consider only a SH wave having a displacement parallel to the x axis, and the displacement U can be expressed by an equation $$U = u \cdot \cos(n\pi y/H) \cdot \exp(j\omega t) \quad (1)$$

according to Onoue and Jumonji's paper entitled "Analysis of an energy entrapping type piezoelectric resonator" (1965, September, Journal of the Institute of Electronics and Communication Engineers of Japan, Vol. 48, No. 9) where u=f(z) which can be rewritten as follows by using k and k' defined such that the propagation constant will always be a real number at respective regions (I) (II) and (III) of the substrate shown in FIG. 2a.

$$U_I = B_{sh}^{ch} k'z - C_{ch}^{sh} k'z \quad (2)$$

$$(-b \leq z \leq -a)$$

$$U_{II} = A_{sin}^{cos} kz \quad (-a \leq z \leq a) \quad (3)$$

$$U_{III} = B_{sh}^{ch} k'z + C_{ch}^{sh} k'z \quad (4)$$

$$(a \leq z \leq b)$$

where A, B and C are constants.

Let us assume that $f_1$ represents a natural resonance frequency of a thickness shear vibration where it is assumed that the electrode portion (II) has an infinite width in the x direction, and that $f_2$ represents the natural resonance frequency when it is assumed that portions (I) and (III) not provided with electrodes have infinite widths in the z direction, the propagation constants k and k' of respective regions II, and I and III are expressed as follows $$k = n\pi \sqrt{(f/f_1)^2 - 1/H} \quad (5)$$

$$k' = n\pi \sqrt{1 - (f/f_2)^2/H} \quad (6)$$

The upper portion of the double notation of equations (2) (3) and (4) gives symmetric vibration in which a displacement U becomes an even function with respect to the original, whereas the lower portion gives an asymmetric oscillation that becomes an odd function.

In equations (1) through (6) described above, the following equation of frequency can be derived out from the boundary condition that the displacement and stress are continuous when $z=\pm a$, and that the end surface is free when $z=\pm b$.

$$\tanh k'(b-a) = k/k' \tfrac{\tan}{\cos} ka \quad (7)$$

Let us determine an equation of approximation of equation (7) when $f_1$ is slightly lower than $f_2$.

Let us denote the observable frequency, that is the resonance frequency by f where the plate thickness is varied in region (II) shown in FIG. 2a or where electrodes are attached.

Then two normalizing frequencies δ and Δ that satisfy the following equation are introduced.

$$f = (1 + \delta) f_1 \quad (8)$$

$$f_1 = (1-\Delta)f_2 \quad (9)$$

From equations (5) and (8), we obtain $$(kH)^2 = (n\pi)^2 . 2\delta \quad (10)$$

From equations (6) and (9), we obtain $$(k'H)^2 = (n\pi)^2 . 2(\Delta - \delta) \quad (11)$$

From equations (10) and (11), we obtain $$k'H/kH = \sqrt{(\Delta - \delta)/\delta} \quad (12)$$

By denoting $\delta/\Delta$ as $\psi$, then $\quad (13)$ $$k'/k = \sqrt{(1-\psi)/\psi} \quad (14)$$

Further, from equations (10) and (13), we obtain $$ka = n\pi\, a\sqrt{2\delta}/H = n\pi\, a\sqrt{2}\,\sqrt{\psi\Delta}/H \quad (15)$$

Further, from equations (11) and (13), we obtain $$k'a = n\pi\, a\sqrt{2\Delta(1-\psi)}/H \quad (16)$$

Substitution of equations (14) (15) and (16) into equation (7) gives an equation $$\tanh n\pi\, a\sqrt{2\Delta(1-\psi)}\cdot(b/a - 1)/H = \sqrt{(1-\psi)/\psi}\;\; {}^{\tan}_{-\cot}\, n\pi\, a\sqrt{2\psi\Delta}/H \quad (17)$$

This equation shows the relationship between the normalized resonance frequency $\Psi$ utilizing $b/a$ as a parameter and the entrapping coefficient $na\sqrt{\Delta}/H$, and corresponds to a general equation resulting in a vibration energy trapping state on a finite plate.

Figure 2B:
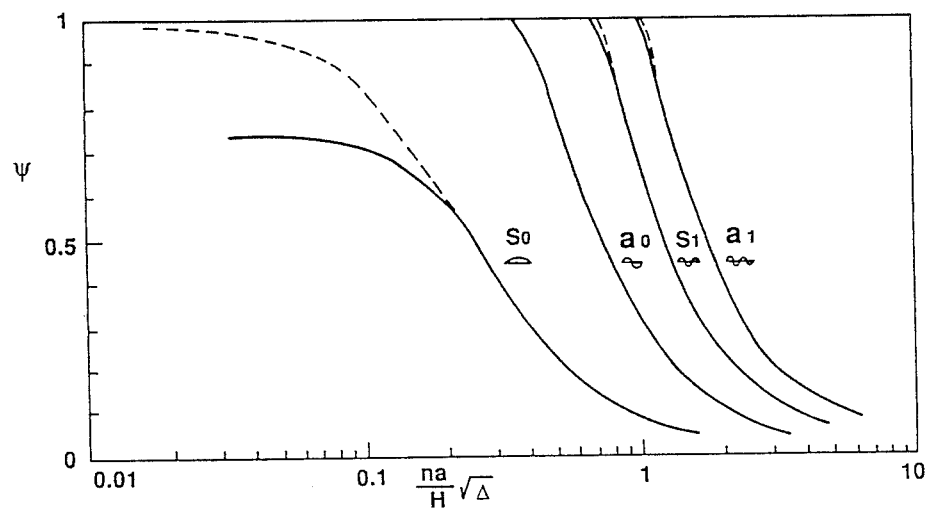
FIG. 2b are graphs showing the result of theoretical analysis.

The frequency spectra of symmetric and asymmetric mode vibrations where $ba=4$ are calculated by using equation (17) and the calculated spectra are compared with those of a infinite plate and the result of comparison is shown in FIG. 2b.

As can be clearly noted from FIG. 2b, the degree of energy entrapping of the lowest order symmetric mode ($S_0$; harmonic mode) vibration varies greatly depending upon the parameter of the substrate, whereas the degree of entrapping higher order symmetric ($S_1$, $S_2$, ...) and asymmetric mode ($a_0$, $a_1$, ...) vibrations can be deemed substantially equal for the infinite plate and the finite plate.

More particularly, the above-mentioned preconditions (2) and (3) can be applied to the finite plate as they are. When compared with the characteristic of the lowest order symmetric ($S_0$; harmonic) mode, the inclinations of the other modes are steep and this tendency becomes remarkable as the mode becomes higher order. This characteristic too is retained in the finite plate.

Based on the above-mentioned facts (1) through (7) constituting the premise of the concept of this invention, it can be readily understood that the following idea can be reached by adding together these facts.

Figure 3A:
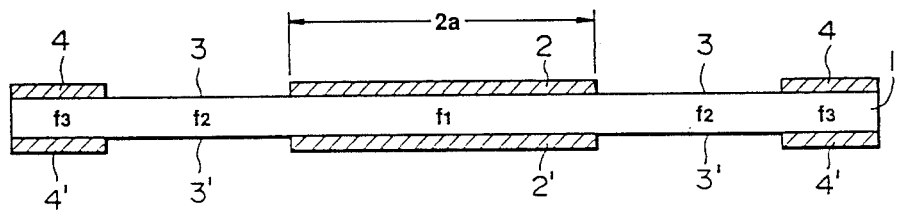
FIG. 3a is a sectional view showing the basic construction of one embodiment of the resonator according to this invention.
Figure 3B:
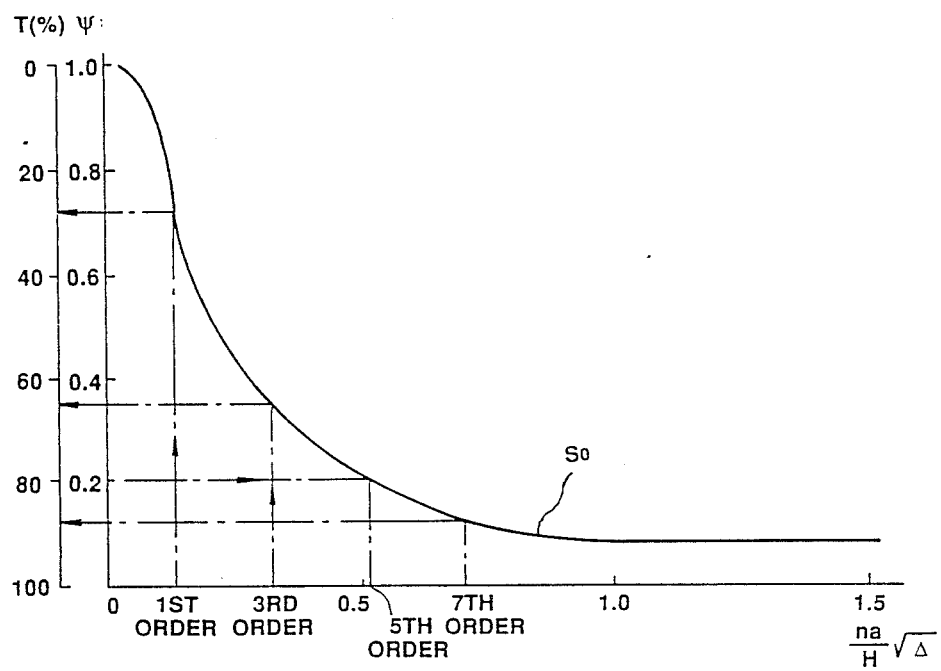
FIG. 3b is a graph showing the method of setting parameters.
Figure 3C:
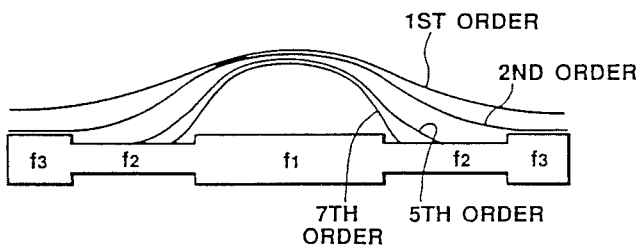
FIG. 3c is a graph showing vibration energy distributions.

FIG. 3a through FIG. 3c are sectional views showing the fundamental construction of the resonator utilizing the vibration of harmonic ($S_o$) mode according to this invention and graphs for explaining the principle of this invention.

As shown in FIG. 3a, electrodes 2 and 2' each having a diameter $2a$ are attached to both surfaces of the central portion of a piezoelectric substrate 1 having a thickness H for decreasing the cutoff frequency of the central portion to $f_1$ thereby providing a difference $(f_2 - f_1)$ in the cutoff frequencies between the central portion and the surrounding portion having a cutoff frequency $f_2$. The portions at which the electrodes 2 and 2' are attached are used as the vibration energy entrapping portions and the portions 3 and 3' not attached with electrodes are used as the vibration energy propagating portion of unwanted vibration. On the periphery of the portions 3 and 3' are formed vibration energy absorbing electrodes 4 and 4' having a cutoff frequency $f_3$ (where $f_3 < f_2$).

When this resonator is used as an overtone vibration resonator of the fifth order, for example, the foregoing principle teaches that the percentage (T) of the vibration energy entrapping the overtone vibration of the fundamental wave (first order) and of the third order should be small and that the entrapping percentage (T) of the overtone vibration of the fifth and higher order should be large. For this reason, as shown in FIG. 3b, the percentage $t_5$ of entrapping the vibration energy of the fifth order overtone vibration is set to about 80%, for example. As can be noted from FIG. 3b, the entrapping coefficient $na\sqrt{\Delta}/H$ at $T_5=80\%$ is about 0.53. In the equation $na\sqrt{\Delta}/H = na\sqrt{(f_2 - f_1)/f_2}/H$, as "n", "H" and $f_2$ are given conditions, it is easy to calculate what value $f_1$ should be selected to. When $f_1$ is determined, since the difference in the cutoff frequencies $(f_2 - f_1)$ is a quantity directly related to so-called plate back, and since the amount of electrode attached satisfying this quantity is already known, the resonator as shown in FIG. 3a can readily be manufactured.

When such material having higher electro-mechanical coupling as lithium niobate, lithium tantalate or a piezoelectric ceramic is used as the piezoelectric substrate, as an extremely small amount of the electrode attached results in an extremely large frequency decrease, it is advantageous to vary the electrode size on the assumption that the amount of frequency decrease has already given.

The cutoff frequency $f_3$ of the vibration energy absorbing areas 4 and 4' may be the same as $f_1$, but if desired, the frequency $f_3$ is increased or decreased thereby increasing, as far as possible, the consumption of the vibration energy in the portions 4 and 4'.

Further, as understood in FIG. 3c, it is preferable that the size of the energy absorbing area is sufficiently long along the direction in which leaked vibration energy is propagated. Although the optimum length has not been theoretically found, it is desirable that an entire area extending from the periphery of the vibration energy propagating portion through the edge of the piezoelectric substrate should be the vibration energy absorbing area in the case where the size of the substrate is determined such that the distortion of the substrate support does not affect the characteristics of the resonator, and the vibration energy entrapping portion and the vibration energy absorbing portion are provided on the surface of the substrate.

In the resonator manufactured as above described, the vibration energies of the fifth, seventh ... overtone are entrapped in the electrode 2 portions as shown in FIG. 3c, the vibration energies of the overtone vibrations of the fundamental wave (first order) and the third order will not be entrapped in any appreciable amount, and these energies are leaked to the outer periphery of the piezoelectric substrate thereby causing the piezoelectric substrate 1 to vibrate in the vibration energy absorbing portions 4 and 4'. Thus the energy is converted into heat in these portions and dissipated, the impedance of the lower order overtone vibrations including the fundamental vibration as viewed from the side of the oscillation circuit becomes higher than that of the higher order overtone vibration in which the energy is entrapped.

This phenomenon can readily be understood if one interprets that lower overtone vibration energy which is weakly entrapped in the energy entrapping portion is propagated through the energy absorbing area in so called energy propagating mode (refer to FIG. 3c).

On the other hand, the overtone vibrations of the fifth order, seventh order . . . overtone vibrations whose vibration energies are entrapped in the electrode on vibration portions as above described, since the impedance of the fifth order is the minimum, this resonator is one in which the fifth order overtone vibration is the most easy to excite.

When the gap of the vibration energy propagating portions 3 and 3' between the vibration energy entrapping portions 2 and 2' and the vibration energy absorbing areas 4 and 4' are extremely small, a portion of the entrapped vibration energy is consumed by the vibration energy absorbing areas. Conversely when the gap is too large, the leakage energy propagate without any loss, so that theoretically, it can be deemed that the oscillation energy absorbing areas do not present as has been described above.

Figure 4A:
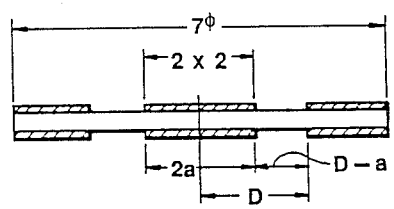
FIG. 4a and 4b, are sectional views and graphs showing the result of experiment for determining the size of a gap at the vibration energy propagating portion.
Figure 4B:
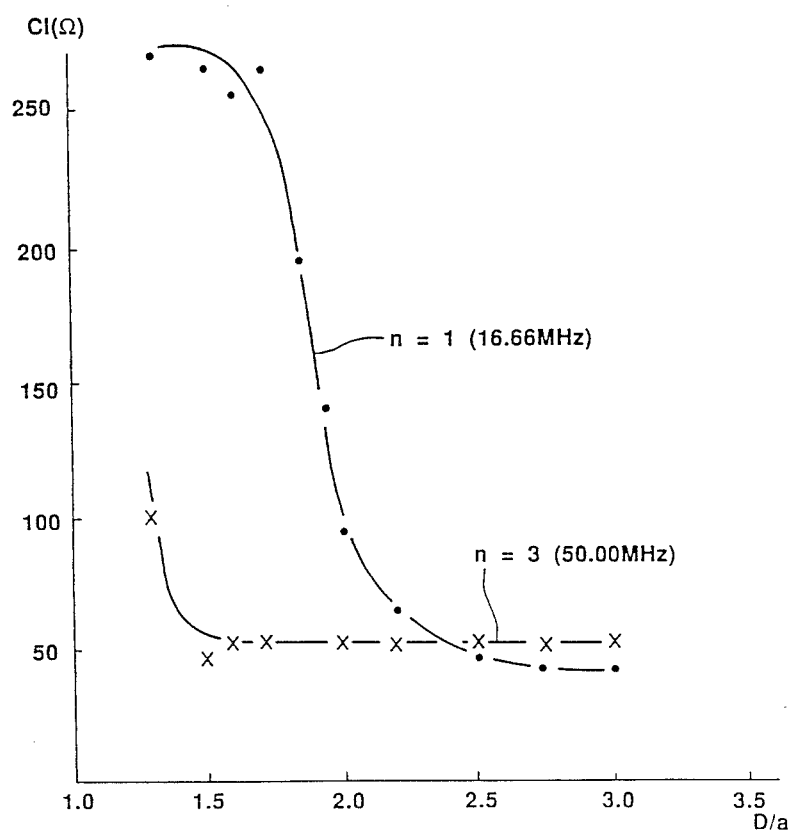

Accordingly, there must be optimum values for the gap. However, as it is difficult to quantitatively determine the value, let us determine the same by experiments. FIG. 4b shows the result of experiments when the vibration energy propagating gap is varied at the time of manufacturing a quartz resonator having the third order overtone vibration (50 MHz). When the gap (D-a) shown in FIG. 4a is too small, both the impedance on the vibration of the fundamental vibration (first order) and that on the third order overtone increases. Conversely, when the gap is too large, there is no difference among the impedances on the first and third overtone vibrations. Consequently, in this case it was found that it is advantageous to select a value of about 1.5 for the ratio D/a so as to give a condition under which the third order overtone vibration is most easy to occur.

The basic principle of this invention has been described hereinabove, actually, however, a resonator having a similar effect can be prepared even when the principle is more or less deviated.

More particularly, as the frequency of an oscillation circuit increases, the gain of the amplifier decreases, the negative resistance of the circuit varies in reverse proportion to the square of the frequency. Accordingly, it is not always true that the oscillation at an overtone frequency at which the resonator impedance as seen from the side of the oscillation circuit becomes a minimum, is easiest.

For example, in FIG. 3b, when the percentage T of entrapping the vibration energy of the fifth order overtone vibration at a desired vibration frequency is set to a value, for example, about 60%, which is considerably lower than 80%. Qualitatively, the impedance on the seventh order overtone vibration may be somewhat smaller than the impedance on the fifth order overtone vibration as shown in FIG. 5. In such a case too, due to the characteristic of the oscillation circuit, the oscillating circuit does not oscillate at the seventh order overtone frequency at which the resonator impedance is the minimum, but at the fifth order overtone frequency the oscillation circuit may happen to oscillate.

Accordingly, the term "desired overtone vibration" does not always mean an overtone vibration at which the resonator impedance as seen from the side of an oscillating circuit becomes minimum. Thus it is sufficient that the impedance on the "desired overtone vibration" is greatly smaller than that on the lower order overtone vibration including the fundamental vibration.

Figure 6A:
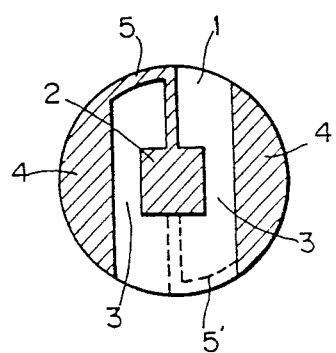
FIG. 6a is a plan view showing one embodiment of the resonator according to this invention.
Figure 6B:
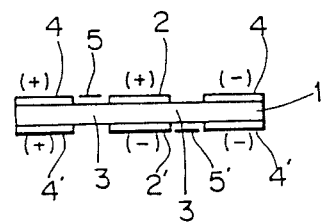
Figure 6C:
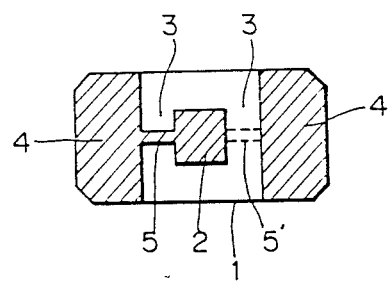
FIGS. 6c-6e are plan views showing resonators having different plan configurations.

The resonator that satisfies the conditions described above may have a plane configuration as shown in FIGS. 6a-6c.

More particularly, as shown in FIGS. 6a and 6b, the vibration energy entrapping electrodes 2 and 2' are disposed at the central portion of a piezoelectric substrate 1, nonelectrode portions 3 and 3' (vibration energy propagating portions) are disposed about the electrodes, vibration energy absorbing electrodes 4 and 4' of a suitable configuration are disposed about the non-electrode portions 3 and 3', both electrodes 2,4 and 2',4' are interconnected by lead patterns 5 and 5' disposed bout the periphery of the substrate 1, and the vibration absorbing electrodes 4 and 4' are connected together to have the same potential.

Thus, by connecting the vibrators and the circuit at the vibration energy absorbing electrodes contacts, the electrodes can be utilized as tub electrodes so that the mechanical strength of the lead connections can be ensured.

As shown in FIG. 6c the lead pattern extending from the vibration energy entrapping portions may be directly connected to the vibration energy absorbing electrodes 4 and 4' through the vibration energy propagating portions 3 and 3'. With this construction, however, it was experimentally confirmed that the desired overtone vibration energy too tends to slightly leak through the lead patterns 5 and 5'. However, this construction is advantageous in that since the lead patterns are short, not only the ohmic loss can be reduced, but also the position alignment between the piezoelectric substrate and a vapor deposited pattern mask is not required to be accurate.

Figure 6D:
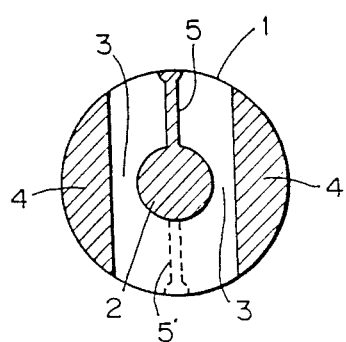
Figure 6E:
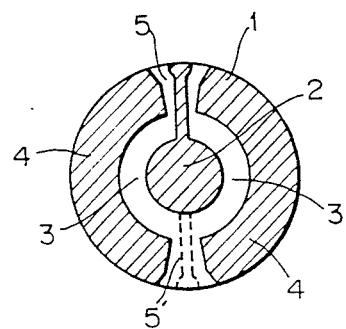

Furthermore, it is not always necessary to integrate the lead patterns 5 and 5' from the vibration energy entrapping electrodes 2 and 2' with the vibration energy absorbing electrodes 4 and 4', but instead they may be separated as shown in FIG. 6d, or as shown in FIG. 6e, the vibration energy absorbing electrodes 4 and 4' may be formed to completely enclose the vibration energy entrapping portions 2 and 2'. This modified construction increases the consumption of the leakage energy thereby increasing the equivalent resistance on the vibration.

It should be understood that the construction of the resonator of this invention can be modified as shown in FIGS. 7a through 7f.

Figure 7A:
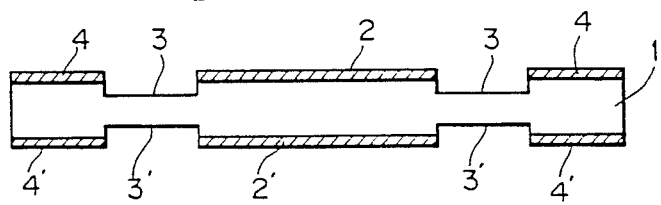
FIGS. 7a through 7g are sectional views showing different sectional configurations of the resonator embodying the invention.
Figure 7B:
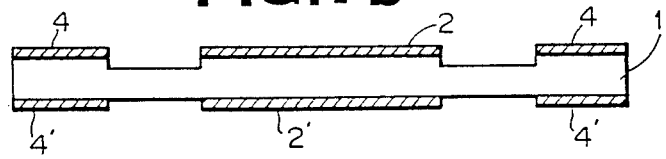

More particularly, in the constructions shown in FIGS. 7a and 7b, the vibration energy propagating portion of the piezoelectric substrate 1 are removed by etching, for example, on both or single surface, for increasing the cutoff frequency of these portions. This construction reduces the thickness of the attached electrodes which not only reduces the electrode vapor deposition time but also prevents peeling off of thick electrodes.

Figure 7C:
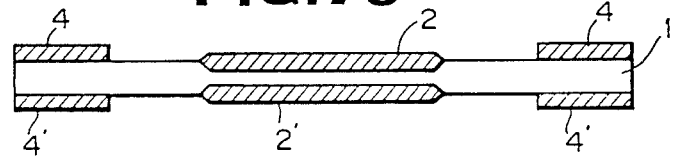

As the frequency is increased, the thickness of the vibration entrapping electrodes 2 and 2' becomes extremely thin whereby the electroconductivity is reduced and the performance of the electrode is lost. To obviate this problem, the thickness of the portions of the piezoelectric substrate corresponding to the electrodes are slightly recessed as shown in FIG. 7c for ensuring necessary electrode thickness.

Figure 7D:
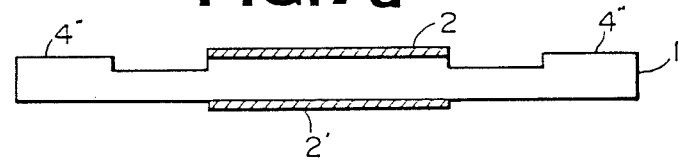
Figure 7E:
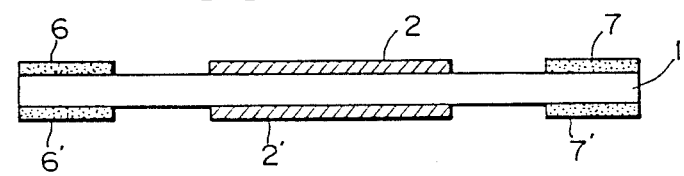

It is not always necessary to attach the electrodes to the vibration energy absorbing areas on the outermost periphery of the piezoelectric substrate, but as shown in FIG. 7d, the thickness of the substrate at that portion is increased for consuming unwanted vibration energy by thick end portions 4".

To attain the above described object, it is not always necessary to increase the thickness of the piezoelectric substrate 1 at the outermost periphery, but a material having a large acoustic loss, for example, lead, tin, gold, etc. may be attached, or organic materials 6,6' and 7,7' such as epoxy resin may be attached with thick film printing technique or the like.

Figure 7F:
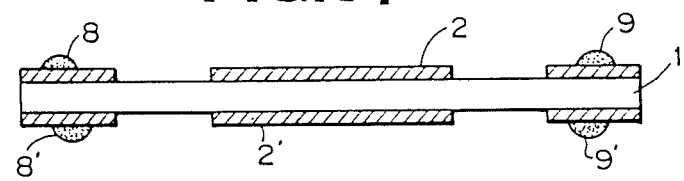

As shown in FIG. 7f, a dot shaped material 8,8' and 9,9' of a large acoustic loss such as electroconductive binder may be applied onto the electrodes 3,3' and 4,4' for consuming unwanted vibration energy. The resonator can be supported at said dot shaped material.

Figure 7G:
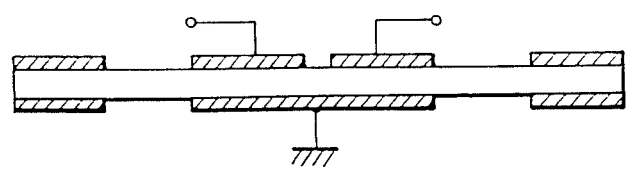

Alternatively, the vibration entrapping electrode 2 as shown in FIG. 7g may be divided to form a 2-port resonator. With this construction, oscillation of desired overtone frequency can be facilitated. In this case, the curves in FIG. 2b can also be referred for the relationship between the vibration energy entrapping coefficient vs. the energy entrapped amount.

The result of experiment made on the characteristics of the resonator of this embodiment will be described in brief.

In this experiment, a resonator having a construction as shown in FIG. 4 and the following specification was used.

| | |
|---|---|
| Quarts (AT cut) substrate | dia. 7 mm |
| Vibration frequency (overtone order) (third order) | 50 MHz |
| Vibration entrapping portion and vibration energy absorbing areas gold electrode, film thickness | 350 Å |
| vibration entrapping electrode size | 2 mm × 2 mm |
| Gap between vibration entrapping electrode and absorbing electrode | 0.5 mm |
| Direction of arrangement of vibration energy absorbing electrode | Z' direction |

In this resonator, the CI values on the fundamental wave vibration and the third order overtone vibration are respectively 150Ω and 52Ω, while the CI value after bonding the lead wire to the resonator using an electroconductive bonding agent are respectively 280Ω and 53Ω which proves the correctness of the theory.

Figure 8A:
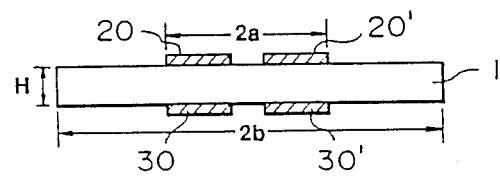
FIG. 8a is a sectional view showing the basic construction of anther embodiment of the overtone oscillation resonator according to this invention.
Figure 8B:
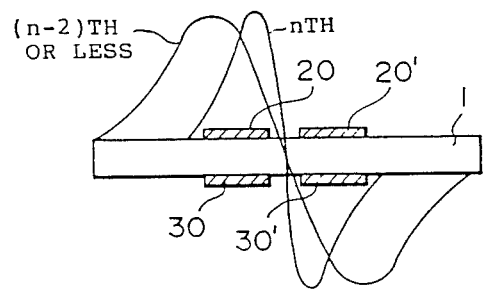
Figure 8C:
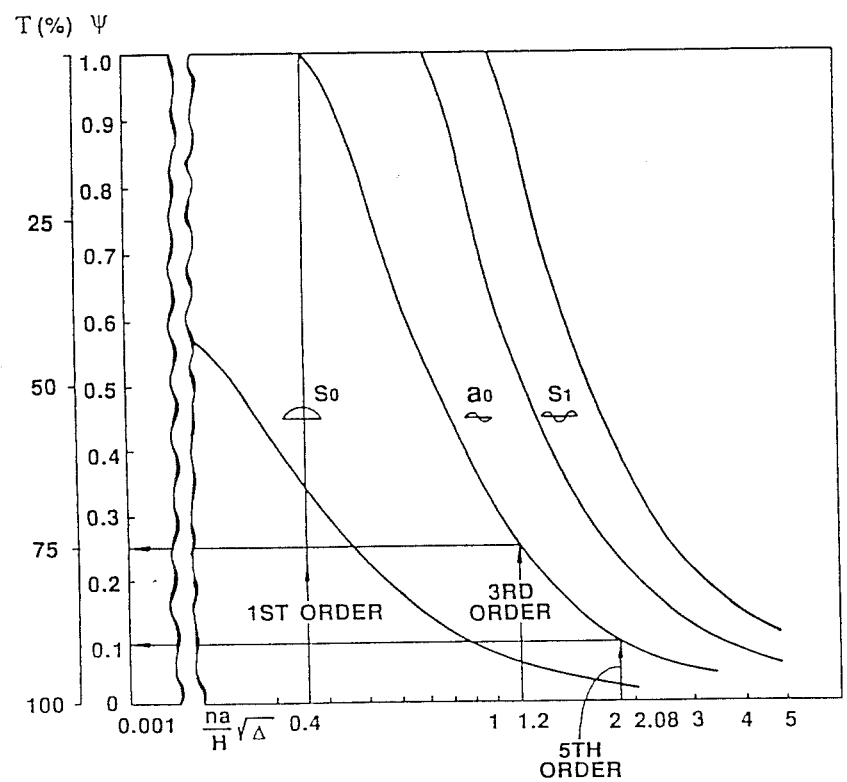
FIG. 8c is a graph for explaining the basic method of selecting various parameters of the resonator.

FIG. 8a through 8c are sectional views showing another fundamental construction of a resonator of this invention utilizing the asymmetric (anharmonic) mode and a graph for explaining the theory thereof. As shown in FIG. 8a, split electrodes 20,20' and 30,30' are applied to both surfaces of the central portion of the piezoelectric substrate 1. When the resonator is excited, an asymmetric ($a_0$) vibration of the lowest order will be strongly excited.

Denoting the order of the overtone at which the resonator is desired to vibrate by n, where the parameters a and $\Delta$ are selected such that the position of the entrapping coefficient $(n-2) a \sqrt{\Delta/H}$ of the $(n-2)$th order shown on the abscissa of FIG. 2b will be positioned at a position at which the percentage of the energy entrapping of the $a_0$ mode curve is zero that is a position at which the entrapped mode does not present, and that the position of $na\sqrt{\Delta/H}$ will be the position at which the percentage of entrapping of the $a_0$ mode curve will be a maximum, the vibration energy of the overtone vibration higher than the n-th order will be entrapped near the peripheries of the split electrodes 20,20' and 30,30' as shown in FIG. 8b, while the vibration energy of the overtone vibration of lower then $(n-2)$th order will spread over the entire body of the piezoelectric substrate 1 and a substantial amount of the spreading energy will leak and consumed through the substrate supporting portion supporting the periphery of the substrate.

The vibration energy of the overtone vibration higher than the n-th order and entrapped near the peripheries of the split electrodes 20,20' and 30,30' has a higher equivalent resistance as the order of the overtone increases as above described, so that the resonator can vibrate at the n-th overtone frequency without modifying the oscillation circuit.

FIG. 8c shows a basic method of selecting parameters where it is desired to obtain a third order overtone vibration resonator by utilizing an excitation of $a_0$ mode. The percentage T of entrapping the $a_0$ mode vibration energy becomes zero when the entrapping coefficient $na\sqrt{a/H}$ is less than 0.4 so that, for the fundamental wave (n=1) vibration and the third order (n=3) overtone vibration, it is sufficient to determine the parameters "a" and "$\Delta$" such that $a\sqrt{\Delta/H}=0.4$, and $3a\sqrt{\Delta/H}=1.2$ The spacing between the split electrodes may be selected to a suitable value so long as short circuiting does not occur between electrodes. Where the interelectrode spacing is extremely small, as is well known in the art, as a result of an acoustic coupling of the asymmetric mode vibration with a symmetric mode vibration which are simultaneously excited, two modes of different vibration frequencies are generated. However, in the resonator of this embodiment, it is sufficient to derive out one of the frequencies, that is in this example only the resonance frequency of the asymmetric mode vibration, so that there is no problem.

Where it is desired to utilize the vibration of the higher mode, for example, $S_1$ mode or $a_1$ mode, each electrode is divided into three or four sections. In this case, as shown in FIG. 2b, the gradient of each mode frequency spectrum becomes steeper as the order becomes higher so that this is advantageous because it is possible to set large the difference in the percentages of entrapping the n-th order overtone vibration energy and that of the order lower than $(n-2)$th order In the above, the basic principle of this invention has been described. Actually, however, a resonator having similar performance can be obtained even when the principle is more or less deviated.

More particularly, as the frequency of an oscillating circuit increases, the gain of its amplifier generally decreases so that the negative resistance of the circuit varies in reverse proportion to the square of the frequency. Accordingly, it is not always true that the vibration at an overtone frequency at which the resonator impedance as seen from the side of the oscillation circuit becomes a minimum is the most easy.

Figure 9:
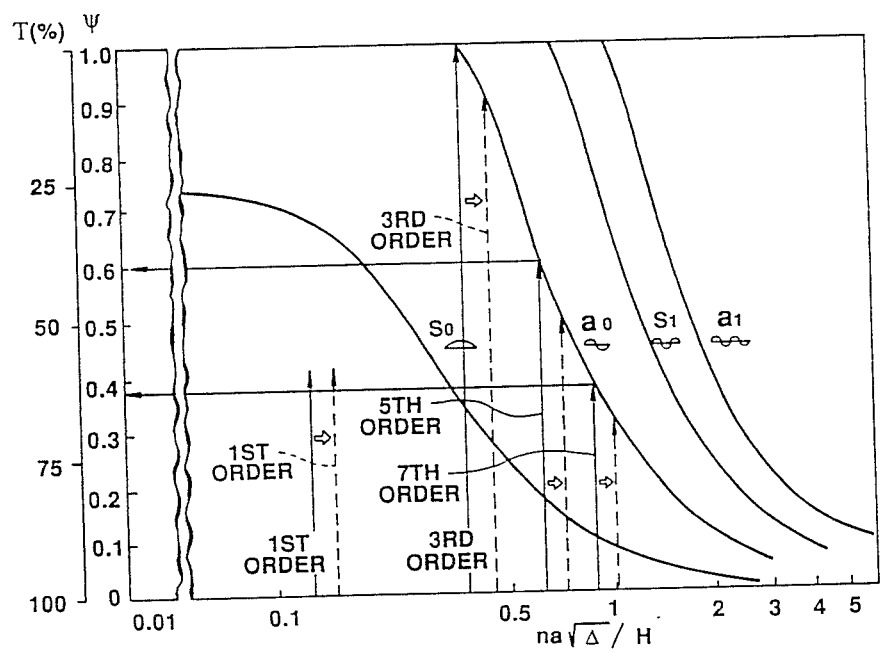
FIG. 9 is a graph for explaining another method of setting parameters necessary for constituting an overtone oscillation resonator embodying the invention.

For example, in FIG. 8c for the purpose of manufacturing the fifth order overtone oscillation resonator by utilizing the vibration of the lowest order asymmetric ($a_0$) mode vibration, when the parameters are selected such that the percentages of entrapping the vibration energies of the first order (fundamental vibration) and the third order overtone vibration are both zero, as shown in FIG. 9, the percentage of entrapping the vibration energy of the fifth order overtone vibration will not become sufficiently large with the result that a case may occur in which the equivalent resistance on the fifth order overtone vibration is higher than that for the seventh order overtone vibration.

In such a case, where the difference between the equivalent resistances on the fifth and seventh order overtone vibrations is small, it can be considered that the vibration of the fifth order overtone frequency is possible in view of the relation to the above described characteristic of the oscillation circuit. However, when the difference between the equivalent resistances on the fifth and seventh order overtone vibrations is large, the oscillating circuit may oscillate at the frequency of the seventh order overtone.

In order to avoid this unstability, the percentage of entrapping the third order overtone vibration energy is made to be slightly larger than zero, and the percentage of entrapping the fifth order overtone vibration energy is selected such that the equivalent resistance on a desired fifth order overtone vibration becomes extremely smaller than that on the third order overtone vibration and that the equivalent resistance is slightly higher than that on the seventh order overtone vibration.

It should be noted that, in this invention, it is not always necessary to make the vibration energy of an overtone vibration (including the fundamental vibration) of the order lower than the order of the overtone desired to vibration to be a perfectly not entrapped mode.

In the foregoing, the invention was described by taking a case utilizing the lowest order asymmetric ($a_0$) mode vibration as an example, parameters "a" and "$\Delta$" can be selected in the same manner as a case wherein a higher order asymmetric ($a_1$, $a_2$...) vibration or a higher order symmetric ($S_2$, $S_2$...) vibration.

Having completed the description of the basic concept of this embodiment, the concrete electrode connection and wirings, necessary for manufacturing a resonator of this invention will be described in detail as follows.

Figure 10A:
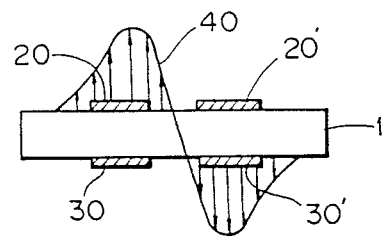
FIG. 10a shows a charge distribution generated by a resonator utilizing an asymmetric mode oscillation of the lowest order.
Figure 10B:
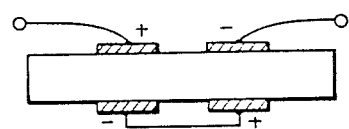
FIG. 10b shows a series connection of the electrodes.
Figure 10C:
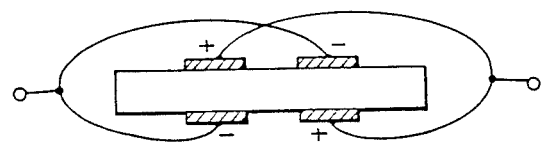
FIG. 10c shows a parallel connection of the electrodes.

An electrode of a conventional resonator is required to be arranged for efficiently deriving out the charge created by the displacement of the piezoelectric substrate. As a consequence, in the resonator of this invention too, it is necessary to coincide the number and positions of the hills or valleys of the charge generated by the vibration mode utilized with those of the split electrode, and to interconnect such that the charges generated at respective electrodes will not cancel with each other.

Where the vibration of the lowest order asymmetric ($a_0$) mode is to utilized, as shown in FIG. 10a, split electrodes 20,20' and 30,30' are attached to the front and rear surfaces of the piezoelectric substrate 1 for generating electric charge having a level as shown in FIG. 10b and the electrodes are connected in series as shown in FIG. 10b or in parallel as shown in FIG. 10c. Since the impedance of the parallel connection is ¼ of that of the series connection, where it is desired to decrease the parallel resistance, parallel connection is preferred.

The spurious of a resonator utilizing a split electrode will now be considered. Where the utilized vibration mode is a higher order symmetric ($S_2$, $S_2$...) mode, an electrically asymmetric ($a_0$, $a_1$, $a_2$...) mode will not be excited, while where the vibration of a higher order asymmetric mode is to be utilized, the symmetric mode will not be excited. However, due to manufacturing errors of the resonator, some other modes are actually excited.

Among the vibration modes utilized, a mode of different order, for example, $a_2$ mode with respect to a mode will be sufficiently excited.

In the former case, however, the response is inherently very small and in the latter case the response is also small because the number of hills or valleys of the generated charge pattern does not coincide with the electrode division pattern so that the response is also small. In any case, the spurious caused by these facts does not reach a level causing a trouble.

For the sake of reference, methods of connecting an electrode split into three sections and utilizing the $S_1$ mode are shown in FIGS. 11a and 11b.

Examples of the wiring pattern to be formed on the piezoelectric substrate of a resonator utilizing an electrode split into two or more sections are shown in FIGS. 12a through 12d. FIGS. 12a and 12b show examples of series and parallel connections of the electrode split into two sections, while FIGS. 12c and 12d show examples of series and parallel connection of the electrode split into 3 sections. Where the wiring patterns 50 and 50'—are made around the edge of the piezoelectric substrate, a conductor pattern is vapor deposited on edge too or an electroconductive point or bonding agent is coated for interconnecting the patterns on the front and rear surfaces.

Since the resonator of this invention is constructed to cause the vibration energy of an overtone vibration of the order lower than that of the desired overtone containing the fundamental vibration to leak and spread over the entire body of the piezoelectric substrate, the leakage energy propagates without loss through portions of a large cutoff frequency thereby leaking out through a resonator support provided for the end of the piezoelectric substrate as described before.

Figure 13A:
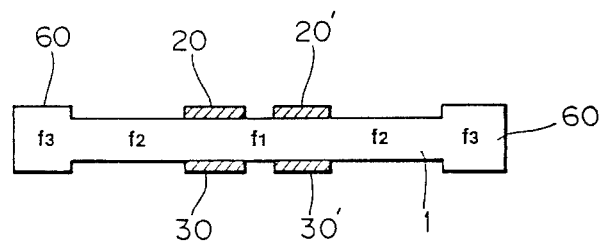
FIG. 13a and FIG. 13b are sectional views showing different constructions of the vibration energy absorbing area.
Figure 13B:
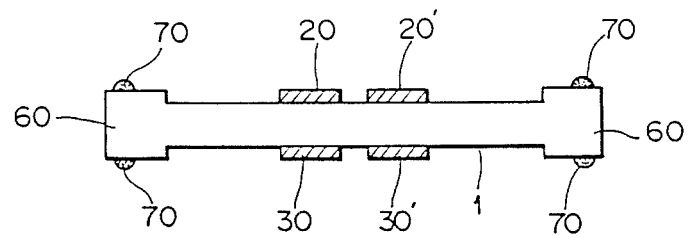

However, it is very important to consume the leakage energy effectively in order to increase the equivalent resistance on the vibrations. For this purpose, the vibration energy absorbing area 60 having an extremely small cutoff frequency $f_3$ are provided on a part or the whole of the edge portion of the piezoelectric substrate 1 as shown in FIG. 13a. With this construction, the amplitude of the leaking vibration energy is increased at this portion where the vibration energy is converted into thermal energy which is consumed thereat. The energy absorbing areas 60 may be provided either by thickening the piezoelectric substrate 1 or by attaching a conduction film or a resin film of an appropriate mass. Alternatively, as shown in FIG. 13b, a mass such as adhesive agent 70 may be attached on the outer surface.

Although the cutoff frequency $f_3$ of the energy absorbing areas 60 may be equal to or less than $f_1$, it is preferable to increase or decrease it so as to maximize the consumption of undesired vibration energy through this areas.

Two different constructions of the overtone vibration resonator utilizing a lower order asymmetric ($a_0$) mode vibration and manufactured based on the principle described above and their characteristics will be described hereunder.

Figure 14A:
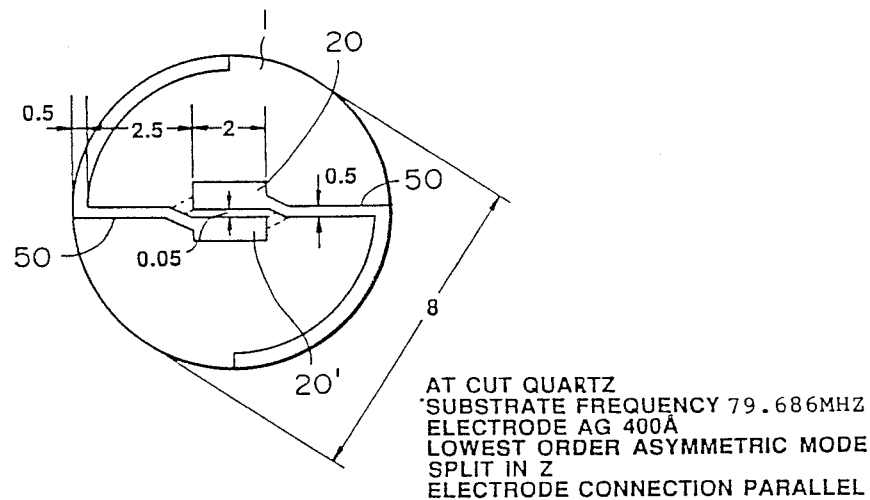

FIG. 14a shows a plan view of a basic third order overtone vibration resonator not provided with a vibration energy absorbing area according to the principle described above. As shown, lead pattern 50 led out from the main electrode 20 and 20' split into two section are provided at the center of a circular quarts substrate for connecting in parallel, the front and rear electrodes having the same construction.

Figure 14B:
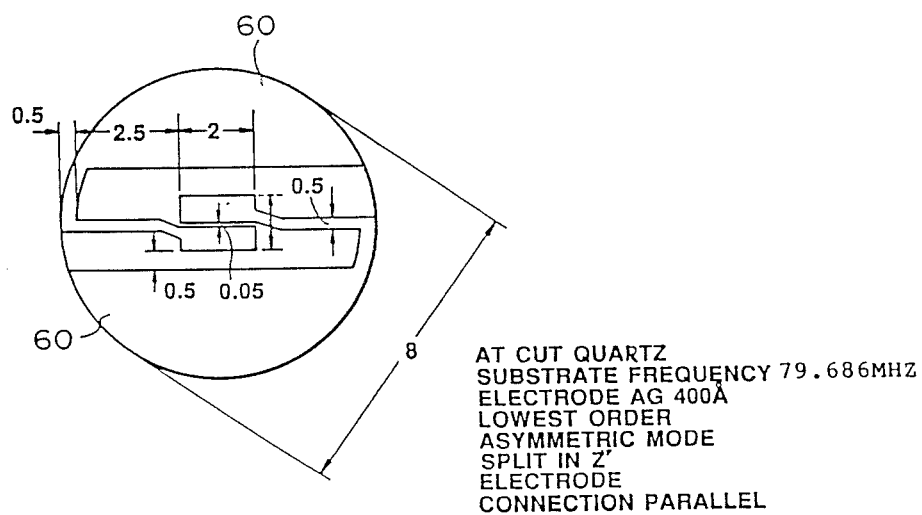

In FIG. 14b, vibration energy absorbing areas 60 are provided for the outer periphery of a quartz substrate. The results of measurement of the characteristics of these two types of resonators show that, in the former, the CI values of the third order and the first order (fundamental) overtone frequencies are 70Ω and 175Ω respectively. When a small quantity of an electroconductive bonding agent is applied to the support portions of this resonator, these values become 72Ω and 380Ω respectively, which proves the correctness of the theory of this invention.

While in the latter, the CI values of the third order and the first order (fundamental) overtone frequencies are 65Ω and 1,250Ω respectively. Where an electroconductive bonding agent is applied to the holder of the quartz substrate, these values become 65Ω and 1330Ω respectively, thus confirming the effectiveness of the vibration energy absorbing areas.

Figure 15A:
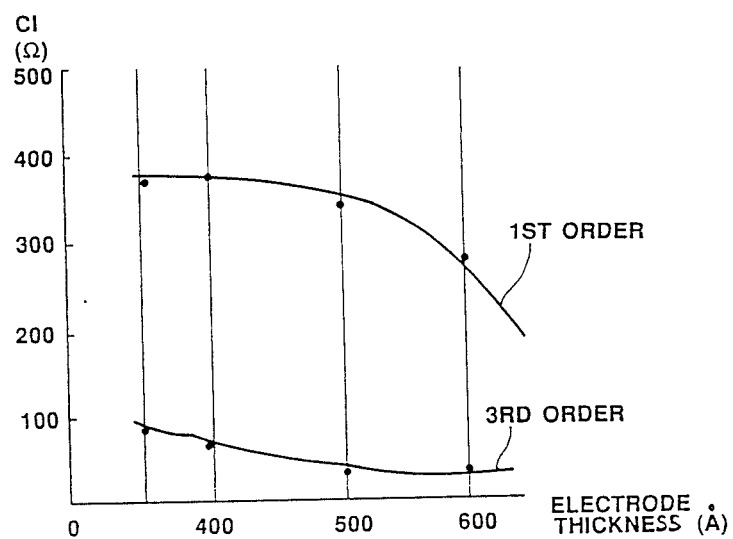
FIGS. 15a and 15b are graphs showing the results of experiments showing the characteristics of the resonators respectively shown in FIG. 14a and FIG. 14b.

In the resonator shown in FIG. 14a, when the quartz substrate holder is fixed by the electroconductive bonding agent and then the electrode film thickness is varied. The difference between the CI values on the third order and the first order overtone frequencies decrease as shown in FIG. 15a.

This means that in the construction shown in FIG. 12a, when "" is caused to vary depending upon the electrode film thickness and both of the first order and the third order overtone vibrations are entrapped, the difference in the CI values decreases. Consequently, it will be clear that various parameters including the electrode film thickness should be set to maintain sufficiently large the difference between their CI values.

Figure 15B:
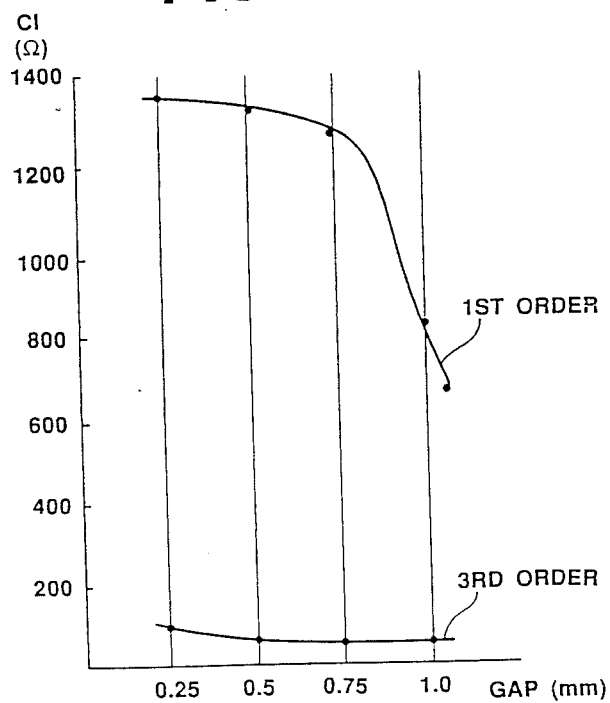

FIG. 15b shows the variation in the CI values on the first order and the third order overtone frequencies where the gap between the exciting electrode and the energy absorbing areas of a resonator provided with the vibration energy absorbing portions shown in FIG. 14b is varied.

As can be noted, as the gap increases, the leaked vibration energy of the first order (fundamental) frequency is not sufficiently consumed by the energy absorbing areas thus decreasing the effect thereof. Accordingly, it is essential to set the gap between the energy absorbing areas and the exciting electrode to an optimum value.

Considering the results of the experiment described above, it will be understood that the vibration energy absorbing area is essential in order to provide sufficiently large difference of CI values between the overtone vibration of the orders whose oscillation is desired and those which should be consumed.

Since the construction of the resonator of this invention varies depending upon various requirements such as characteristic, manufacturing and frequency adjustment, the construction can be variously modified as shown in FIGS. 16a through 16d.

Figure 16A:
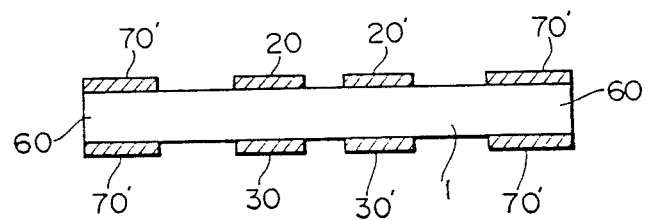
FIG. 16a through 16d are sectional views showing different constructions of the resonators embodying the invention.
Figure 16B:
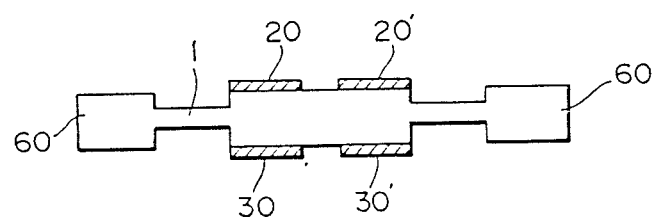
Figure 16C:
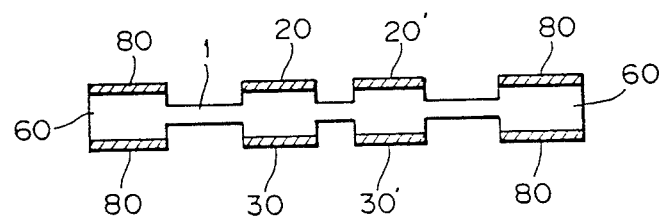
Figure 16D:
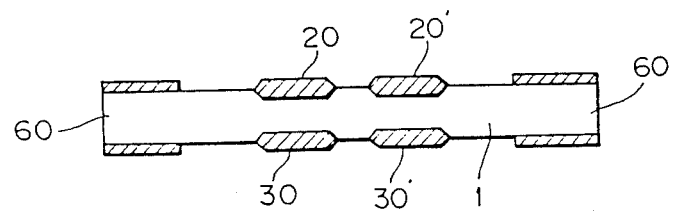

More particularly in the construction shown in FIG. 16a, resin films 70' are applied to the vibration energy absorbing portions 60 on the periphery of the piezoelectric substrate for decreasing the cutoff frequency of the portions 60. FIG. 16b shows a construction in which, for the purpose of obtaining a sufficiently large cutoff frequency difference, the thicknesses of the substrate between the main electrodes 20 and 30 at the center of the substrate and the vibration energy absorbing portions 60 are reduced by etching for increasing the cutoff frequency thereof. FIG. 16c shows a construction in which the thickness of the substrate is reduced between the main electrodes 20 and 30 and electrodes 80 are attached to the vibration energy absorbing portions 60. Thereby enabling electrothermic conversion of the vibration energy. In FIG. 16d, for the purpose of preventing increase in the electric resistance due to the decrease in the film thickness of main electrodes 20,20' and 30,30', only the electrode contacts to the substrates are etched to reduce their thicknesses.

The foregoing embodiments illustrate only few examples of the construction of the resonator of this invention, and if desired, suitable combinations of these constructions can be used.

although in the foregoing embodiment, a resonator utilizing the lowest order asymmetric ($a_0$) mode vibration and having simplest construction was described, it should be understood that the invention is not limited to this construction but can use higher order symmetric ($S_1$, $S_2$---) mode vibrations as well as higher order asymmetric ($A_1$, $A_2$---) mode vibrations.

The vibration mode of an illustrated resonator is the lowest order asymmetric vibrations mode of a quartz substrate excited in Z direction, but the quartz substrate can also be excited in X direction. Furthermore, it is possible to divide the electrode in Z and X directions for exciting vibrations in both directions.

Although in FIG. 14b, the vibration energy absorbing areas were provided in the Z direction, these portions can be provided in the X direction, or around substantially the entire periphery of the substrate or the portions can be divided into a plurality of sections. The vibration energy absorbing areas becomes more efficient as the area thereof covering the periphery of the substrate increases.

The invention is not limited to a thickness twist vibration as shown in FIGS. 14a and 14b but is also applicable to such vibration mode as thickness longitudinal and thickness shear vibrations. In addition, various types of the piezoelectric material can also be used.

Although not shown in the drawing, the resonator may be a two port resonator having a three terminal electrode construction. This construction makes easy vibration in high frequency bands. When the invention is applied to a monolithic crystal filter, a filter characteristic having a small spurious over a wide frequency range can be expected.

Figure 17A:
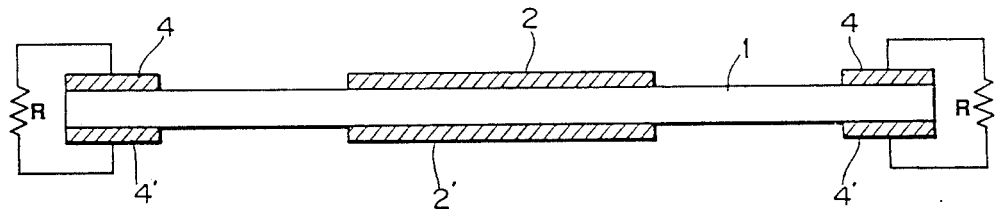
FIGS. 17a and 17b are sectional views showing the basic construction of the other embodiment of the overtone oscillation piezoelectric resonator according to this invention.
Figure 17B:
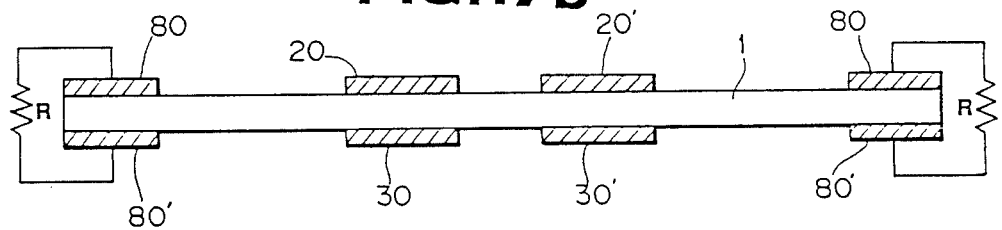

FIGS. 17a and 17b shows still another embodiment of this invention in which resistors R having suitable values are connected across electrodes 4 and 4' or 80 and 80' on both surfaces of the energy absorbing areas near the outer periphery of the piezoelectric substrate.

With this modification, the vibration energy of an order lower than the desired overtone order propagates to the vibration energy absorbing areas excites the piezoelectric substrate 1 at the vibration absorbing areas, and the electric charge generated in the electrodes 4 and 4' or 80 and 80' is converted into heat energy by resistors R and then consumed, whereby the impedance on the lower order overtone vibration containing the fundamental vibration increases sufficiently.

Figure 18:
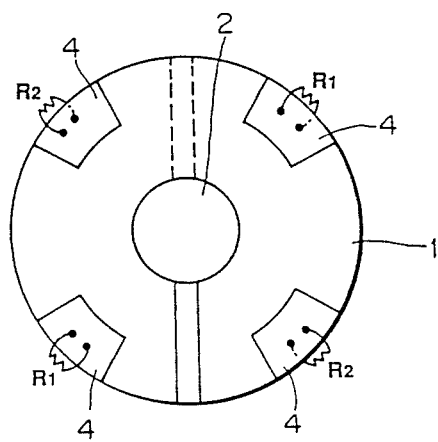
FIG. 18 is a plan view showing the basic principle of a resonator in which there are a plurality of overtone vibrations, the vibration energies thereof are to be absorbed.

The value of resistor R is set to be substantially equal to $(2\pi f_n C_o)^{-1}$ where $C_0$ represents the capacitance between electrodes 4 and 4' or 80 and 80' and fn the frequency of the overtone vibration, the energy thereof is to be converted into heat and consumed. This condition corresponds to the impedance matching of an alternating current circuit so that it is a most efficient measure for absorbing unwanted vibration energy.

Where it is necessary to consume a plurality of vibration energies of the fundamental (first order) and the third order overtones such as the fifth order overtone vibration resonator, a frequency $f_m$ intermediate of the fundamental frequency $f_{n1}$ and the third order overtone frequency $f_{n3}$ is used for setting the value of resistor to $R = (2\pi f_m C_0)^{-1}$. Alternatively, as shown in FIG. 18, the vibration energy absorbing electrodes 4 and 4' or 80 and 80' are divided and resistors having values of $R_1 = (2\pi f_{n1} C_o)^{-1}$ and $R^2 = (2\pi f_{n3} C_0)^{-1}$ respectively are connected across respective divided electrodes.

Figure 19A:
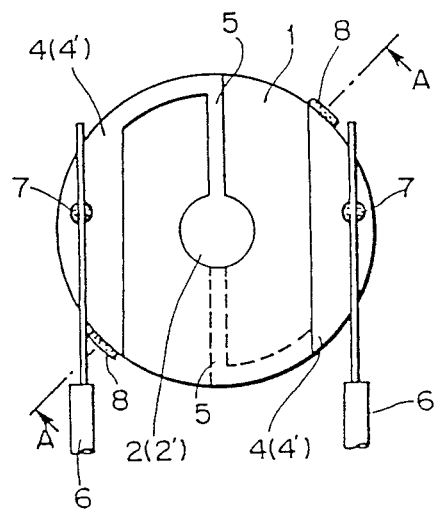
FIG. 19a is a plan view showing another embodiment of this invention.
Figure 19B:
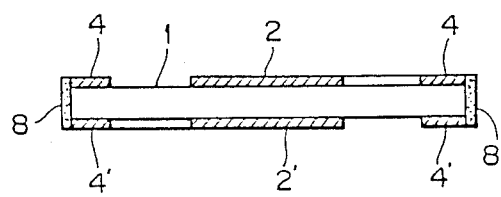

FIG. 19a is a plan view showing a modification based on this principle and FIG. 19b is a sectional view of this modification taken along a line A—A. In this modification, vibration enrapping electrodes 2 and 2' are provided for both surfaces at the center of a quartz substrate 1, and the electrodes 2 and 2' are connected to vibration energy absorbing electrodes 4 and 4' at suitable areas on the outer periphery of the substrate 1 via patterns 5 and 5'

The electrodes 4 and 4' are secured to resonator holding portions 6 upwardly extending from a base, not shown, for supporting the resonator by using an electroconductive bonding agent 7 for making electrical connection and mechanical fixing.

In this case, care should be taken not to short circuit the front and rear electrodes 4 and 4' by the electroconductive bonding agent 7.

By applying a bonding agent 8 having a desired resistance value to suitable portions of the electrodes 4 and 4', absorption of the unwanted vibration energy can be increased.

Figure 20:
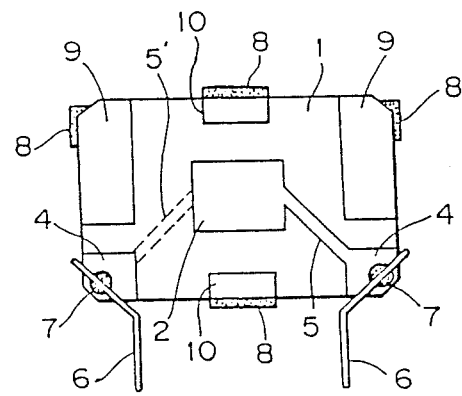
FIG. 20 is a plan view showing still another embodiment of this invention.

As the bonding agent 8 can be used an epoxy resin containing a controlled quantity of dispersed carbon particles.

Where there are a plurality of wave motions whose vibration energies are to be absorbed, the vibration energy absorbing electrodes 4 and the peripheral surface of the substrate 1 are split as shown in FIG. 20, and the split electrodes 9 and 10 are bonded to the front and rear surfaces with the resistive bonding agent 8 described above. Of course, the resistance value of the bonding agent should correspond to the frequency of the wave motions whose vibration energies are to be absorbed.

Figure 21A:
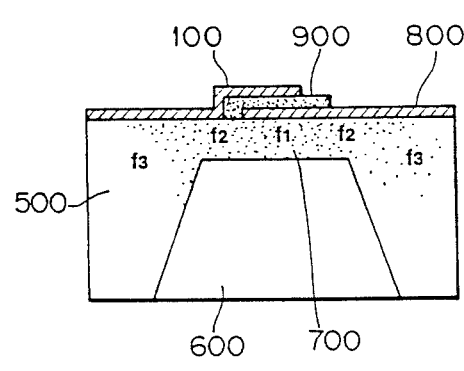
FIG. 21a is a sectional view showing the other embodiment of the overtone oscillation piezoelectric resonator according to this invention.
Figure 21B:
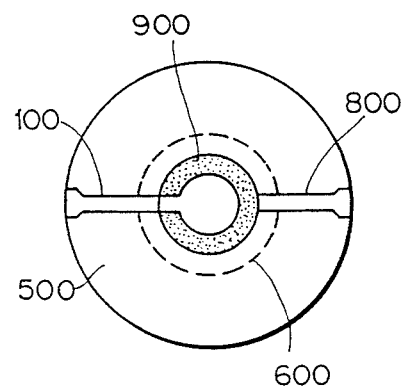

FIGS. 21a and 21b show another embodiment of a resonator utilizing a composite material for use in a GHz band. As shown, boron (B) is doped into one surface of a silicon block 500, and a recess 600 of a desired diameter is formed by etching the opposite surface.

Then a flat thin layer 700 having a thickness equal to that of the layer doped with boron and cannot be itched will remain. Then a lower electrode and its lead wire 800 are formed by vapor deposition. After that, $Z_nO$ is sputtered to form a $Z_nO$ layer 900 of a desired thickness, and an upper electrode and its lead electrode 100 are vapor deposited on the ZnO layer 900. The portions covered by the electrodes 800 and 100 are utilized as the vibration energy entrapping portions having a cutoff frequency $f_1$. The thin layer 700 extending about the outer peripheries of the electrodes is used as the vibration energy transmitting portion having a cutoff frequency $f_2$, and the not etched portion 500 of the silicon block is used as a vibration energy absorbing area having a cutoff frequency $f_3$. Then a relation $f_3 > f_1 > f_2$ holds automatically so that by suitably controlling the ratio between $f_1$ and $f_2$, the absolute value of $f_2$ and the diameters of the electrodes 800 and 100, an overtone vibration piezoelectric vibrator capable of vibrating at a desired order of overtone vibration can be obtained since these values correspond respectively to the plate-back amount "Δ", substrate thickness "H" and the electrode size "a" which are the parameters of the entrapping coefficient.

As is well known in the art as it is possible to manufacture extremely thin layer 700 and sputtered $Z_nO$ layer 900, and hence having a high fundamental wave vibration frequency, it will be clear that it is possible to provide a high frequency oscillation circuit having 3, 5 or 7 times frequency and not requiring any special circuit, for example, a LC tuning circuit.

Figure 22:
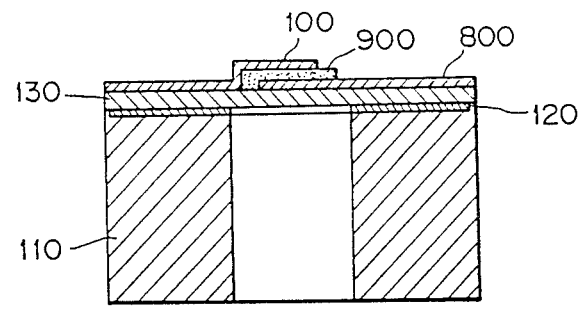
FIG. 22 and 23 are sectional views showing the other embodiments of this invention.

The resonator is not limited to a silicon block. Although the manufacturing steps becomes more or less complicated, as shown in FIG. 22, an opening having a desired diameter is formed at the center of an artificial quartz or glass block 110 by mechanical machining or etching, and a quartz or glass plate 130 is strongly bonded to one surface of the block by a three layer alloy bonding agent 120 consisting of Al-Ag-In. After lapping the quartz or glass plate to a desired thickness, upper and lower electrodes 800 and 100 and a piezoelectric portion 900 made of $Z_n O$ and sandwiched between the upper and lower electrodes are formed.

Figure 23:
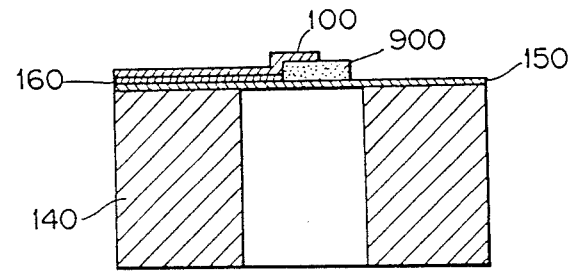

Alternatively, an opening is formed through the central portion of a metal block 140 as shown in FIG. 23, and a metal plate 150 of the same material is seam welded to one surface of the metal block 140. Then the metal plate 150 is lapped to a desired thickness thereby forming a vibration portion. When such metal plate 150 is used as the vibration portion, it can be used as the lower electrode, the piezoelectric substrate 900 can be directly sputtered onto the thin metal plate 150 and an insulating film 160 is applied onto only the lead pattern wiring of the upper electrode attached to the piezoelectric portion 900. Thereafter, the lead pattern is formed.

In addition to $Z_nO$, AlN and $C_dS$ can also be used the piezoelectric material, and other method than sputtering can be used as the method of attaching the piezoelectric material. However, as the sputtering deposition method is most suitable for preparing extremely thin piezoelectric layer, this method can satisfy the object of this invention for preparing a resonator of an extremely high frequency. This is case, usually since the crystal grows in the axial direction, the vibration mode is limited to the thickness longitudinal vibration.

Also, in this embodiment, a thickness shear vibration mode and a thickness twist vibration mode can be used.

Figure 24:
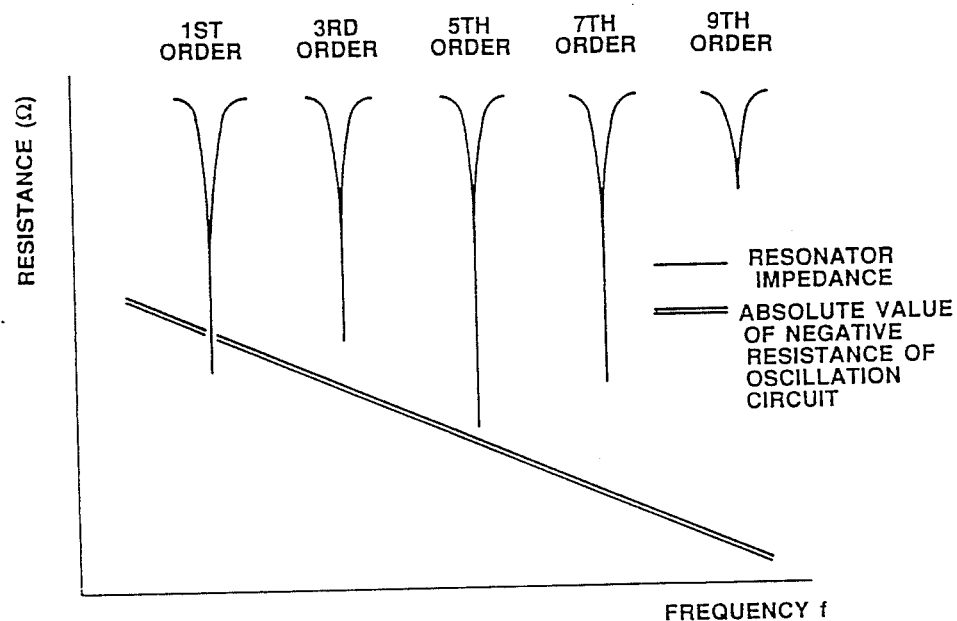
FIG. 24 is a graph showing the relationship between the resonator impedance and the characteristic of the oscillation circuit of overtone frequencies of respective orders of the resonator embodying the invention.

In the vibration energy absorbing area 4 shown in FIG. 3a, the consumption of an overtone vibration energy on an order lower than that of the desired overtone vibration after converting it into heat, is not sufficient as that the impedance at a corresponding frequency does not rise sufficiently. Thus a desired overtone oscillation may become impossible in view of the negative resistance characteristic of the oscillation circuit as shown in FIG. 24.

Figure 25:
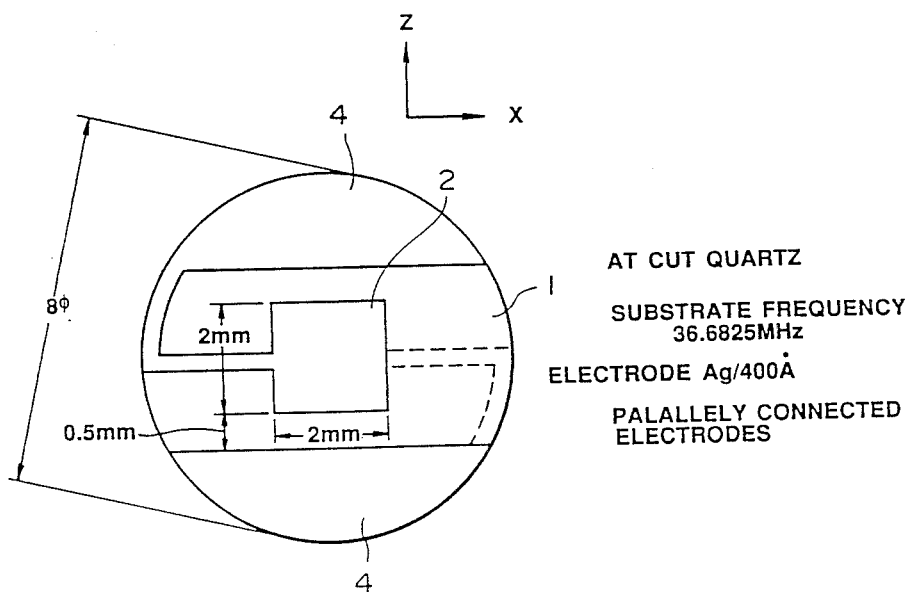
FIG. 25 is a plan view of a resonator utilized for the experiment made for investigating the film thickness ratio of the vibration energy absorbing area.

Accordingly, an experiment was carried out by using an overtone vibration resonator shown in FIG. 25 in which the thickness of attaching the vibration energy absorbing electrode 4 was varied for determining the difference between the CI value of the fundamental vibration and the CI value of the desired third order overtone vibration.

FIG. 26 is a graph showing the result of experiment in which after fixing the size of the exciting electrode 2 made of Ag, the film thickness is varied for varying the entrapping coefficient na$\sqrt{\Delta}$/H. For eight entrapping coefficients, the thickness of Ag film of the vibration energy absorbing electrodes 4 was varied to 1, 2, 4 and 8 times of that of the exciting electrode, and the relation between the CI value of the fundamental vibration to be suppressed and the CI value of the desired third order overtone vibration was plotted.

As can be noted from FIG. 26, the CI value of the fundamental vibration to be suppressed has a peak value except a case wherein the ratio (film thickness ratio) between the thickness of the energy absorbing electrode made of Ag and that of the excitation electrode is 1 (one), the peak value increasing with the increase in the film thickness ratio.

The same tendency was observed in the fifth order and the seventh order overtone vibration resonators although figures were omitted for the sake of simplicity.

Above described result of experiment shows that it is necessary to make lower the cutoff frequency of the vibration energy absorbing area than that of the vibration energy entrapping portion attached with an excitation electrode. Otherwise, in general, it is difficult to have a sufficient difference between the CI value of the overtone vibration of an order at which the oscillation is desired and that of the lower order overtone vibration containing the fundamental vibration to be suppressed, thus disenabling stable oscillation at a desired overtone frequency.

When designing an overtone vibration piezoelectric resonator as shown in FIG. 3a, it is essential to select the relation between a film thickness ratio at which the CI value for an overtone vibration of an order at which the oscillation is desired to be extremely low while the CI value of the overtone vibration of a lower order including the fundamental vibration is extremely high, and the value of the entrapping coefficient by taking into consideration the result of experiment described above.

The result of experiment shown in FIG. 26 shows that optimum parameters for the third order overtone vibration resonator can be obtained when the film thickness ratio of the energy absorbing portion to the excitation electrode is selected to be 4 and the entrapping coefficient na$\sqrt{\Delta}$/H is selected to be about 4.5.

Figure 27A:
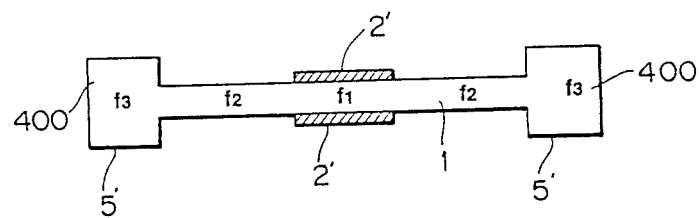
FIG. 27a through 27c are sectional views showing different constructions of the vibration energy absorbing area.
Figure 27B:
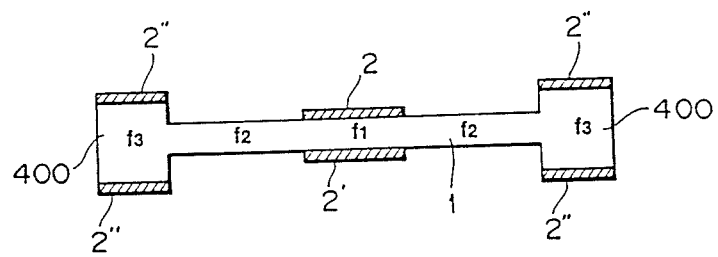
Figure 27C:
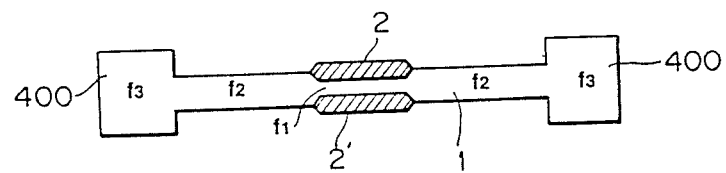

In addition to the method in the above-described experiment in which the vapor deposition time is made longer, the cutoff frequency of the vibration energy absorbing area can be decreased by forming a recess at the central portion of the substrate 1 as shown in FIGS. 27a through 27c for creating difference of cutoff frequencies between the central portion and the peripheral portion. Alternatively, as shown in FIG. 27b, the same material 2" as the electrode 2 can further be vapor deposited onto the vibration energy absorbing area 400 thus formed. The cutoff frequency can be made more lower by using a vapor deposited material having a higher specific gravity than that of the electrodes 2 and 2' (FIG. 27b).

Further, as shown in FIG. 27c, for the purpose of obtaining a higher overtone vibration frequency, where the portions of the piezoelectric substrate on which the excitation electrodes 2, 2' are to be attached are made particularly thin, it is sufficient to increase the thickness of the portions of the substrate which constitute the vibration energy absorbing areas 400.

The cutoff frequency $f_2$ of the piezoelectric substrate about the electrodes 2 and 2' is not always necessary to be perfectly the same in the whole area, and a slight difference is permissible. Even when the cutoff frequency $f_3$ of the vibration absorbing areas 400 at the periphery of the piezoelectric substrate varies substantially so long as the condition $f_3 < f_1$ is satisfied, there is no problem.

An electrode construction of the piezoelectric resonator will now be described that enables to compensate for the deterioration of the resonator characteristic caused by the deviation of the position of additional vapor deposition effected for the purpose of fine adjustment of the vibration frequency, and to greatly decrease the influence upon the resonator characteristic caused by the difference in the thickness of the piezoelectric substrate thereby increasing the upper limit of the resonance frequency.

FIG. 28a is a sectional view showing the fundamental construction of the electrode of such piezoelectric resonator.

More particularly, a surface electrode 2 is attached near the central portion of the surface of a piezoelectric substrate 1 and a rear electrode 2' having the same or wider area is attached to the rear surface, and the frequency is adjusted by applying an additional vapor deposition to the electrode 2'.

With this measure, even when the position of the additional vapor deposition for the fine adjustment of the frequency displaces a little, since the area of the additional vapor deposition is substantially wider than the area of the surface electrode, for example by about 1.5 times, there is no possibility of resulting in a new spurious. Even when the spurious is generated it is possible to limit it to an extremely low level, thereby causing no problem. FIG. 28b shows a construction wherein the rear electrode 2' is extended to cover the entire rear surface of the piezoelectric substrate. This construction has the same advantage as that of the embodiment shown in FIG. 28a. However, since the position of the vapor deposition mask utilized at the time of manufacturing the resonator may be rough, the construction shown in FIG. 28b is advantageous from the view point of productivity.

The piezoelectric vibrator having the electrode construction just described is advantageous for the following application.

It is inevitable that the thickness of a piezoelectric substrate varies more or less during the manufacturing steps. In such case, in the prior art vibrator, the resonance frequency is matched by applying an additional vapor deposited film onto the surface electrode. This measure can eliminate variation in the resonance frequency, but since the amounts of plate back are different, the amount of entrapping the vibration energy is also different. As a consequence, the state of occurrence of the spurious caused thereby is different for respective vibrators.

When this electrode construction is applied to such case, there arises an effect as shown in FIGS. 29a and 29b.

More particularly, when an additional vapor deposition film 300 is added to the entire surface of the rear electrode 2' covering the entire rear surface as shown in FIG. 29b for matching the resonance frequency to that of FIG. 29a, the overall thickness of the piezoelectric substrate 1 increases so that an effect equivalent to that obtained when the natural frequency of the substrate itself is adjusted. Consequently, not only the adjustment of resonance frequency of the vibrator is possible but also vibrators of less variation in the characteristic can be mass produced.

This construction is advantageous for obtaining a vibrator required to have a high resonance frequency.

More particularly, when preparing a resonator described above, the electrode is desired to have a film thickness sufficient to provide a desired percentage of vibration energy entrapping. The parameter that governs the percentage of vibration energy entrapping is called an entrapping coefficient which is given by $na\sqrt{\Delta/H}$, where "n" designates an order number of the overtone, "a" the electrode size, "$\Delta$" the amount of plate feed back and "H" the substrate thickness.

Where a vibrator having a high resonance frequency is desired, the designer is requested to select parameters of the entrapping coefficient for obtaining desired energy entrapping percentage on a mode curve irrespective of what mode of vibration is used.

There is an optimum value of the entrapping coefficient that minimizes accompanying auxiliary resonances.

When investigating respective parameters of the entrapping coefficient, the substrate thickness "H" is substantially determined by the desired resonance frequency and the electrode size "a" is obliged to be determined to a predetermined value due to an equivalent inductance etc., so that only the remaining parameter, that is the amount of plate back "$\Delta$", that is the electrode film thickness (sum of the surface and rear film thicknesses) presents a problem.

As can be noted from the definition of the entrapping coefficient, the electrode film thickness becomes thin as the resonance frequency increases. Consequently, in the prior art resonator, the thin electrode film is divided into equal sections on the front and rear surfaces, the respective sections can not act as the electrodes from the standpoint of electroconductivity. As is well known in the art, the thickness of the electrode film should be larger than 350 Å from the standpoint of electroconductivity irrespective whether what type of metal is used.

Assuming that the film thickness of the surface electrode that determines the resonator characteristic, for example, the frequency of generating the auxiliary resonances is set near the limit of the electrode thickness, for example about 400 Å, this thickness determines the upper limit of the resonance frequency which is possible to design.

Since the film thickness of the electrode covering the entire rear surface has no influence upon such characteristic as the auxiliary resonance, the film thickness can be exclusively used to determine the frequency For this reason, the thickness of the front and rear electrodes may be 400 Å and more. This measure enables to realize a piezoelectric resonator having a high resonance frequency which as been impossible in the past.

A trially manufactured AT cut quartz resonator had a substrate diameter of 5 mm, substrate thickness of 19 $\mu$m, a diameter of the surface and rear electrodes of 3 mm, a film thickness of 700 Å, a diameter of the surface electrode of 1.4 mm, a film thickness of 500 Å and a resonance frequency of 88 MHz. It was found that there was no problem of the auxiliary resonance.

Assuming a diameter of 5 mm, a quarts substrate having a thickness of about 20 $\mu$m can be manufactured according to the present technique of polishing quartz. However, a resonator having diameter of 5 mm with electrodes of a thickness of about 500 Å close to the limit that satisfies the electrical characteristic attached to both surfaces of the substrate will have a substrate thickness of about 24 microns and its resonance frequency is limited to about 68 MHz. Thus, by using the electrode construction of this invention, the upper limit of the resonance frequency that has been considered possible can be increased by 30%.

Furthermore this electrode construction is advantageous for the electrode of an overtone oscillation piezoelectric resonator as described above requiring a delicate adjustment.

FIG. 30a is a plan view showing an overtone oscillation resonator, which is the most basic resonator utilizing the lowest order symmetric (S$_0$) mode. As shown, a vibration energy entrapping excitation electrode 2 is provided at the center of the piezoelectric substrate 1 and leaked vibration energy absorbing electrodes 4 and 4' are attached to suitable positions on the outer periphery of the piezoelectric substrate, the electrodes 2, 4 and 4' being formed as conductor vapor deposited patterns.

In the prior art, the construction of the rear electrode is the same as that shown in FIG. 30a.

In an overtone oscillation resonator having above described electrode construction, unless the gap between the exciting electrode 2 and the vibration energy absorbing area 4 is maintained at a suitable value, that is when the gap is too large, the leaked vibration energy will not be consumed sufficiently. On the contrary, when the gap is too small the vibration energy of a desired overtone vibration too is absorbed and consumed, thus disenabling oscillation at the desired frequency. Consequently, where the position of the additional vapor deposition to the excitation electrode 2 for the purpose of frequency adjustment becomes different, a serious problem occurs.

The problem described can be eliminated and the adjusting steps can be simplified by providing a rear electrode 6 on the rear surface of the substrate, which covers both of the excitation electrode 2 and the vibration energy absorbing area 4, as shown in FIG. 30b.

Since the overtone oscillation resonator of this invention is constructed to generate an overtone oscillation (a high frequency oscillation) by utilizing the inherent characteristic of the resonator without utilizing any special means, for example a LC tuning circuit, the fact that the higher fundamental frequency of the resonator is a desirable characteristic. Accordingly, when the electrode construction just described is applied to this overtone oscillation resonator not only the problem occurring at the time of adjusting the resonator characteristic can be solved but also the resonance frequency of the resonator can be increased, which are extremely advantageous.

Figure 31A:
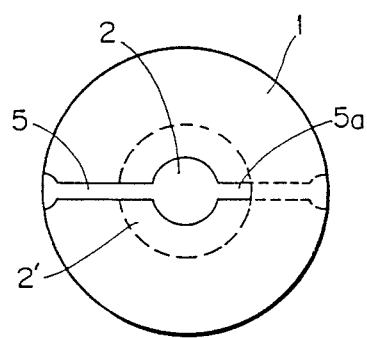
FIG. 31a and 31b are plan views showing different electrode constructions utilized in the embodiment shown in FIGS. 30a and 30b.
Figure 31B:
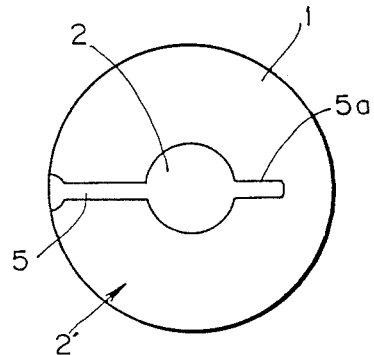

In a resonator having a single excitation electrode 2, whether the rear electrode 2' has a small area (FIG. 31a) or a large area covering the entire rear surface (FIG. 31b) it is necessary to lead out a lead pattern 5. However, the relative size of the rear electrode 2' and the lead pattern 5 causes an unbalance of the mechanical vibration of the piezoelectric substrate. To alleviate such unbalance, a balancing pattern 5a acting as a counter balance weight is added to a suitable portion of the exciting electrode.

This construction can also be applied to a two port vibrator wherein the exciting electrode is divided into a plurality of sections or to a dual mode filter having a similar electrode construction.

Figure 32A:
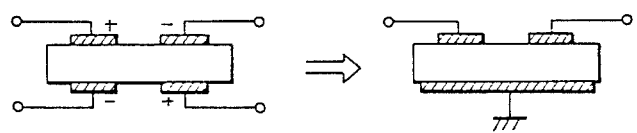
FIG. 32a through 32c are sectional views respectively showing a two port oscillator or a dual mode filter, an overtone oscillator utilizing an asymmetric ($a_0$) mode oscillation at the lowest order, and an overtone oscillator utilizing a symmetric ($S_1$) mode oscillation of the highest order.
Figure 32B:
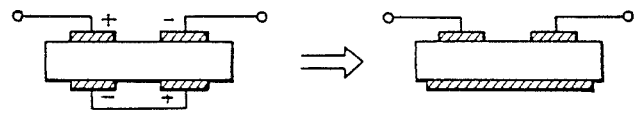
Figure 32C:
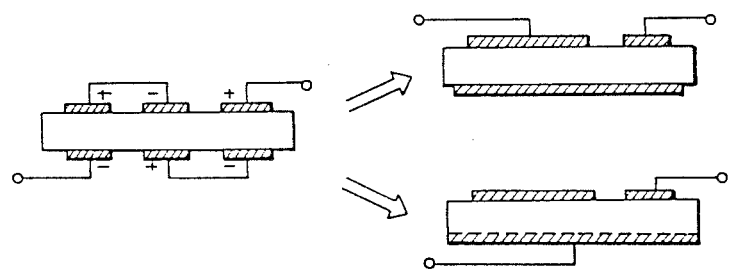

FIG. 32a shows the electrode construction when the present invention is applied to a two port resonator or a dual mode filter. FIG. 32b shows the electrode construction when the present invention is applied to an overtone oscillation resonator utilizing the lowest order asymmetrical ($a_0$) mode vibration, and FIG. 32c shows the electrode construction when the present invention is applied to an overtone oscillation resonator utilizing a higher order asymmetric ($S_1$) mode vibration.

With these electrode constructions, the problem of spurious caused by the displacement of the vapor deposition portion can be eliminated with simplified adjustment, etc. by merely varying the area or thickness of the electrode on the front or rear side of the substrate. In addition, variation in the resonator characteristic caused by the variation in the percentage of vibration energy entrapping caused by the variation in the thickness of the piezoelectric substrate, when the vibration frequency thereof is adjusted.

Moreover, as it is possible to increase the upper limit of the frequency of the resonator the invention can provide a resonator having an excellent temperature characteristic and capable acting as a frequency source for various electronic apparatus and devices, the operating frequency increasing in recent years.

APPLICABILITY TO INDUSTRY

Since the resonator of this invention is constructed as above described the resonator can readily generate an overtone frequency without changing the manufacturing steps of the prior art or without adding to the oscillation circuit any specific circuit, for example, a LC tuning circuit. Accordingly, the resonator of this invention can be advantageously used as a frequency source of various electronic apparatus and devices which are desired to operate at higher frequencies and to be constructed as integrated circuits of higher densities.

Further in a conventional piezoelectric resonator, especially in such thickness vibration type resonator as an AT cut quartz resonator having an excellent temperature characteristic, when it is desired to obtain a high frequency at the fundamental wave vibration, the thickness of the piezoelectrics substrate becomes extremely small, thus making it difficult to manufacture. However, according to this invention, the resonator can be readily excited at an overtone frequency so that the thickness of the piezoelectric substrate can be selected in a range of ready manufacture thereby decreasing the manufacturing cost.

What is claimed is:

1. An overtone oscillation piezoelectric resonator including a piezoelectric substrate which comprises:

a vibration energy entrapping portion having a cutoff frequency $f_1$;

a portion having a cutoff frequency $f_2$ (where $f_1 < f_2$) and being provided around said vibration energy entrapping portion so as to strongly excite every order of overtone vibrations on a harmonic mode or on a specific anharmonic mode; and at lease one vibration energy absorbing area having a cutoff frequency $f_3$ (where $f_3 f_2$), said vibration energy absorbing area being spaced from said energy entrapping portion by a gap of a predetermined distance and extending substantially to an edge of said piezoelectric substrate, said gap constituting a vibration energy propagating portion, wherein the thickness of said piezoelectric substrate, amount of plate back defined by $(f_2 - f_1)/f$ and the size of said vibration energy entrapping portion are determined such that the vibration energy of overtone vibrations whose orders are equal to or higher than n-th order which is strongly excited is substantially entrapped within said vibration energy entrapping portion and its periphery while the vibration energy of overtone vibrations of (n−2)th order or lower order including the fundamental vibration is caused to spread over the entire body of said piezoelectric substrate, the width of said gap between said vibration energy entrapping portion and said vibration energy absorbing area being such that substantially all of said entrapped vibration energy is unleaked to said energy absorbing area, and a great deal of said spread vibration energy is absorbed through said vibration energy absorbing area, thereby making easier oscillation caused by said n-th overtone vibration than oscillation caused by overtone vibrations of (n-2)th order or lower order including the fundamental vibration.

2. The resonator as set forth in claim 1 wherein said vibration energy entrapping portion comprises a single energy entrapping portion.

3. The resonator as set forth in claim 1 wherein said vibration energy entrapping portion is split into at least two sections.

4. The resonator according to claim 3 wherein said vibration energy entrapping portion excites higher orders of the symmetric (anharmonic) mode vibration.

5. The resonator as set forth in claim 3 wherein said vibration energy entrapping portion excites the asymmetric (anharmonic) mode vibration.

6. The resonator as set forth in claim 1 wherein a resistor of a predetermined resistance value is connected across electrodes attached to opposing surfaces of said vibration energy absorbing area, thereby increasing consumption of the vibration energy spread over the entire body of said substrate.

7. The resonator as set forth in claim 6 wherein the value of said resistor connected across said electrodes is made substantially equal to $(2\pi f_n C_o)^{-1}$ where $C_o$ represents capacitance between said electrodes, and $f_n$ represents an overtone frequency whose vibration energy is to be absorbed.

8. The resonator as set forth in claim 6 wherein the value of said resistor connected across said electrodes is made to be substantially equal to $(2\pi f_m C_o)^{-1}$ where $f_m$ represents a predetermined frequency which takes a value between a plurality of overtone frequencies including a fundamental frequency to be absorbed.

9. The resonator as set forth in claim 6 wherein said electrodes attached to both surfaces of said vibration energy absorbing area are divided into a plurality of sections and the values of resistances connected across the electrode sections are made to be substantially equal to $2\pi f_{n1} C_o)^{-1}$, $(2\pi f_{n3} C_o)^{-1}$---respectively where $f_{n1}$, $f_{n3}$ --- represent a fundamental frequency and a third order overtone frequency ---.

10. The resonator as set forth in claim 1 wherein the cutoff frequency $f_3$ of said vibration energy absorbing area is smaller than that $f_1$ of said vibration energy entrapping portion.

11. The resonator as set forth in claim 1 wherein a surface electrode of said vibration energy entrapping portion is attached to said piezoelectric substrate and a rear electrode having a larger area than said surface electrode is attached to the rear surface of said piezoelectric substrate so as to decrease variation in the resonator characteristics caused by adjustment of the film thickness or the area of the electrode.

12. The resonator as set forth in claim 11 wherein said surface electrode is divided into a plurality of sections.

13. The resonator as set forth in claim 11 wherein a balance pattern having a mass corresponding to that of a lead pattern extending between said surface electrode and the periphery of said substrate is provided for the surface of said piezoelectric substrate for balancing the vibration of said resonator.

14. The resonator as set forth in claim 2 wherein said vibration energy entrapping portion excites the lowest order of the symmetric (harmonic) mode vibration.

15. An overtone oscillation piezoelectric resonator comprising:
    a block made of a vibration medium, and having a cutoff frequency $f_3$;
    a thin layer portion made of the same material as said vibration medium, and provided at a predetermined portion of said block;
    a piezoelectric material portion including an excitation electrode attached to substantially the center of the thin layer portion, for providing a vibration energy entrapping portion having a cutoff frequency $f_1$ (where $f_1 \geq f_3$), a part of said thin layer portion extending between said vibration energy entrapping portion and said part serving as a vibration energy propagating portion having a cutoff frequency $f_2$ (where $f_2 > f_1$), said block serving as a vibration energy absorbing area having a cutoff frequency $f_3$ and adapted to absorb vibration energy propagated through said vibration energy propagating portion,
    wherein configuration of said excitation electrode is determined so as to strongly excite every order of overtone vibrations on a harmonic mode or on a specific anharmonic mode, and an entrapping coefficient n $a\sqrt{\Delta/H}$ in said strongly excited mode (where "n" represents a desired harmonic overtone order, "a" the size of said energy entrapping portion, "$\Delta$" the amount of plate back defined by $(f_2-f_1)/f_2$ and "H" the thickness of the vibration energy propagating portion) is determined such that substantially all of the vibration energy of overtone vibrations whose orders are equal to or higher than n-th order is entrapped within said vibration energy entrapping portion and its periphery while leaking the vibration energy of overtone vibrations whose orders are lower than said n-th order via said vibration energy propagating portion so as to consume the vibration energy through said vibration energy absorbing area, thereby enhancing oscillation caused by the n-th overtone vibration more than oscillation caused by overtone vibrations lower than the n-th order including the fundamental vibration.

16. The resonator according to claim 15 wherein said vibration medium is silicon.

17. The resonator as set forth in claim 15 wherein said block is made of quartz or glass, and a quartz or glass substrate is bonded to an opening formed at a predetermined portion of said block with a bonding agent, and said substrate is ground to have a predetermined thickness.

18. The resonator as set forth in claim 15 wherein said vibration medium is metal, and a substrate made of the same metal is attached to an opening formed at a predetermined portion of said block, and said substrate is ground to have a predetermined thickness.

19. The resonator according to claim 14 wherein said piezoelectric material comprises $Z_nO$, AlN, or $C_dS$.

* * * * *